United States Patent

Shiozaki

(10) Patent No.: US 9,490,820 B2
(45) Date of Patent: Nov. 8, 2016

(54) FRACTIONAL N-PLL CIRCUIT, OSCILLATOR, ELECTRONIC DEVICE, AND MOVING OBJECT

(71) Applicant: Seiko Epson Corporation, Tokyo (JP)

(72) Inventor: Nobutaka Shiozaki, Shiojiri (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/848,902

(22) Filed: Sep. 9, 2015

(65) Prior Publication Data

US 2016/0079988 A1    Mar. 17, 2016

(30) Foreign Application Priority Data

Sep. 12, 2014  (JP) ................................. 2014-186606

(51) Int. Cl.
| | |
|---|---|
| *H03L 7/06* | (2006.01) |
| *H03L 7/08* | (2006.01) |
| *H03L 7/093* | (2006.01) |
| *H03L 7/14* | (2006.01) |
| *H03M 3/00* | (2006.01) |

(52) U.S. Cl.
CPC ............. *H03L 7/0802* (2013.01); *H03L 7/093* (2013.01); *H03L 7/14* (2013.01); *H03M 3/30* (2013.01)

(58) Field of Classification Search
USPC .................................. 327/147–149, 156–158
See application file for complete search history.

(56) References Cited

U.S. PATENT DOCUMENTS

| | | | |
|---|---|---|---|
| 6,600,378 B1 * | 7/2003 | Patana | H03L 7/1978 327/156 |
| 7,015,738 B1 * | 3/2006 | Cao | H03C 3/0925 327/156 |
| 7,071,787 B2 * | 7/2006 | Knierim | H03L 7/1976 327/147 |
| 7,408,419 B2 | 8/2008 | Ko | |
| 7,881,419 B2 * | 2/2011 | Shin | H03L 7/081 327/156 |
| 7,928,779 B2 | 4/2011 | Song | |
| 7,928,805 B2 | 4/2011 | Casagrande | |
| 8,531,244 B2 | 9/2013 | Shibata et al. | |

(Continued)

FOREIGN PATENT DOCUMENTS

| | | |
|---|---|---|
| JP | 2005-191684 A | 7/2005 |
| JP | 3935308 B2 | 6/2007 |

(Continued)

*Primary Examiner* — Adam Houston
(74) *Attorney, Agent, or Firm* — Harness, Dickey & Pierce, P.L.C.

(57) ABSTRACT

In order to appropriately set an operation range of a voltage controlled oscillator without excessively increasing a frequency at which delta-sigma modulation is performed, a fractional N-PLL circuit includes: a voltage controlled oscillator that is configured to set plural output frequency ranges; a frequency selection circuit that selects one output frequency range; a division circuit; and a division setting circuit that sets a division ratio of the division circuit. The division setting circuit performs, while the frequency selection circuit is searching for the plural output frequency ranges of the voltage controlled oscillator, the delta-sigma modulation at a frequency lower than a frequency after the frequency selection circuit terminates the search.

19 Claims, 11 Drawing Sheets

(56) References Cited

U.S. PATENT DOCUMENTS

| | | | | |
|---|---|---|---|---|
| 8,779,812 B1* | 7/2014 | Kavanagh | | H03L 7/087 327/150 |
| 8,866,519 B1* | 10/2014 | Hiebert | | H03L 7/1976 327/147 |
| 9,041,444 B1* | 5/2015 | Tarighat Mehrabani | . | H03L 7/00 327/157 |
| 2003/0197564 A1* | 10/2003 | Humphreys | | H03L 7/087 331/11 |
| 2009/0015338 A1* | 1/2009 | Frey | | H03L 7/0802 331/16 |
| 2009/0212835 A1* | 8/2009 | Xu | | H03L 7/1974 327/156 |
| 2011/0204940 A1* | 8/2011 | Kanda | | H03C 3/095 327/157 |
| 2011/0267146 A1* | 11/2011 | Finocchiaro | | H03L 7/10 331/2 |
| 2014/0340161 A1* | 11/2014 | Canard | | H03L 7/0992 331/16 |
| 2015/0341042 A1* | 11/2015 | Balachandran | | H03L 7/093 327/156 |
| 2016/0079988 A1* | 3/2016 | Shiozaki | | H03L 7/0802 327/156 |

FOREIGN PATENT DOCUMENTS

| | | |
|---|---|---|
| JP | 2012-028835 A | 2/2012 |
| JP | 2012-147080 A | 8/2012 |

* cited by examiner

| RANGESET | RANGE | FREQUENCY RANGE (MHz) |
|---|---|---|
| 0 | 1 | 3000~3010 |
| 1 | 2 | 3010~3020 |
| 2 | 3 | 3020~3030 |
| 3 | 4 | 3030~3040 |
| 4 | 5 | 3040~3050 |
| ⋮ | ⋮ | ⋮ |
| 62 | 63 | 3620~3630 |
| 63 | 64 | 3630~3640 |

FRACTIONAL N-PLL CIRCUIT, OSCILLATOR, ELECTRONIC DEVICE, AND MOVING OBJECT

BACKGROUND

1. Technical Field

The present invention relates to a fractional N-PLL circuit, an oscillator, an electronic device, and a moving object.

2. Related Art

An oscillator in which a fractional N-PLL circuit is connected to a rear stage of an oscillation circuit and setting of a division ratio of the fractional N-PLL circuit is changed by an external terminal to output plural frequencies is known. A phase locked loop (PLL) circuit feeds back a voltage based on a phase difference between a reference signal and a feedback signal obtained by dividing an output signal of voltage controlled oscillator by a division ratio Q to the VCO to obtain an output frequency corresponding to Q times the reference frequency. For example, since the fractional N-PLL circuit switches plural integer division ratios using a delta-sigma modulated signal and obtains its average value as the division ratio Q, it is possible to set the division ratio Q as a fraction in addition to an integer. Further, in order to widely secure an output frequency range of the fractional N-PLL circuit, a method for using the VCO with a range switching function is also known. Such a VCO may reduce a frequency conversion gain in each range while securing a wide frequency variable range by allowing selection of plural ranges having different output frequency ranges. If the frequency conversion gain is reduced, frequency dependency on voltage noise of a peripheral circuit is reduced, and thus, it is possible to suppress phase noise characteristics of an output signal of the VCO, and to enhance resolution of frequency response with respect to a control voltage. The fractional N-PLL circuit that includes a VCO with a range switching function and switches plural division ratios using delta-sigma modulation is disclosed in JP-A-2012-28835, for example.

In the fractional N-PLL circuit in the related art using the VCO with the range switching function and the delta-sigma modulation circuit, as disclosed in JP-A-2012-28835, at the time of starting or when the setting of the division ratio is changed, an optimal range is searched for while switching the range of the VCO. Thus, for example, when performing a high speed search using a binary search method or the like, an output frequency of the VCO may become a high frequency which cannot be obtained in a steady state (in a normal operation). It is necessary that the delta-sigma modulation circuit follow the feedback signal to be operated, and similarly, it is necessary that the delta-sigma modulation circuit is operated at a high frequency which cannot be obtained in the steady state during the search of the range of the VCO. Thus, in the fractional N-PLL circuit in the related art, there is a problem in that the delta-sigma modulation circuit should have a surplus specification so as not to perform an erroneous operation during the search of the range of the VCO, which causes an increase in circuit size and power consumption.

SUMMARY

An advantage of some aspects of the invention is to provide a fractional N-PLL circuit capable of appropriately setting an operation range of a voltage controlled oscillator without excessively increasing a frequency at which delta-sigma modulation is performed. Another advantage of some aspect of the invention is to provide an oscillator, an electronic device and a moving object including such a fractional N-PLL circuit.

The invention can be implemented as the following forms or application examples.

A fractional N-PLL circuit according to this application example of the invention includes: a voltage controlled oscillator that is configured to set a plurality of output frequency ranges with respect to a control voltage range; a frequency selection circuit that searches for the plurality of output frequency ranges of the voltage controlled oscillator to select one output frequency range; a division circuit that is provided on a signal path from an output end of the voltage controlled oscillator to an input end of the voltage controlled oscillator; and a division setting circuit that performs delta-sigma modulation to set a division ratio of the division circuit. The division setting circuit performs, while the frequency selection circuit is searching for the plurality of output frequency ranges, the delta-sigma modulation at a frequency lower than a frequency after the frequency selection circuit terminates the search.

According to the fractional N-PLL circuit according to this application example, since the division setting circuit performs, while the frequency selection circuit is searching for the plural operation ranges (output frequency ranges) of the voltage controlled oscillator, the delta-sigma modulation at a frequency lower than the frequency after the frequency selection circuit terminates the search, even though the output frequency of the voltage controlled oscillator becomes a high frequency which cannot be obtained in a steady state (in a normal operation) during the search, it is possible to normally set the division ratio of the division circuit. Accordingly, according to the fractional N-PLL circuit according to this application example, it is possible to appropriately set an operation range of the voltage controlled oscillator without excessively increasing the frequency at which the delta-sigma modulation is performed.

In the fractional N-PLL circuit according to the application example, the division setting circuit may perform the delta-sigma modulation at a frequency of $1/N_1$ ($N_1$ is an integer of 2 or greater) of an output frequency of the division circuit while the frequency selection circuit is searching for the plurality of output frequency ranges.

According to the fractional N-PLL circuit according to this application example, since the fractional N-PLL circuit can update the division ratio of the division circuit in synchronization with the output signal during the search of the operation ranges of the voltage controlled oscillator, it is possible to secure the approximation accuracy of the output frequency of the division circuit. Accordingly, according to the fractional N-PLL circuit according to this application example, it is possible to appropriately set the operation range of the voltage controlled oscillator.

In the fractional N-PLL circuit according to the application example, the division setting circuit may perform the delta-sigma modulation at a frequency of $1/N_2$ ($N_2$ is an integer of 1 or greater, which is smaller than $N_1$) of the output frequency of the division circuit after the frequency selection circuit terminates the search of the plurality of output frequency ranges.

According to the fractional N-PLL circuit according to this application example, it is possible to update the division ratio of the division circuit in synchronization with the output signal of the division circuit even though the search of the operation ranges of the voltage controlled oscillator is terminated, and thus, it is possible to secure the approximation accuracy of the output frequency of the division circuit.

Accordingly, according to the fractional N-PLL circuit according to this application example, it is possible to appropriately set desired output frequency accuracy in a steady state.

The fractional N-PLL circuit according to the application example may further include a clock generation circuit that generates, while the frequency selection circuit is searching for the plurality of output frequency ranges, a clock signal with a frequency lower than a frequency after the frequency selection circuit terminates the search using an output signal of the division circuit. The division setting circuit may perform the delta-sigma modulation in synchronization with the clock signal.

According to the fractional N-PLL circuit according to this application example, since the frequency of the clock signal is switched before and after the search of the operation ranges of the voltage controlled oscillator, it is possible to commonly use one delta-sigma modulation circuit before and after the search. Accordingly, according to the fractional N-PLL circuit according to this application, it is possible to suppress an excessive increase in area cost.

In the fractional N-PLL circuit according to the application example, the frequency selection circuit may search for the plurality of output frequency ranges using the clock signal.

According to the fractional N-PLL circuit according to this application example, since the fractional N-PLL circuit performs the search of the operation ranges of the voltage controlled oscillator using a clock signal of a frequency lower than the output frequency of the division circuit, it is possible to reduce power consumption, compared with a case where the search of the operation ranges of the voltage controlled oscillator is performed using the output signal of the division circuit.

In the fractional N-PLL circuit according to the application example, the division setting circuit may include a first delta-sigma modulation circuit, a second delta-sigma modulation circuit, and a switching circuit that selects an output signal of the first delta-sigma modulation circuit while the frequency selection circuit is searching for the plurality of output frequency ranges, and selects an output signal of the second delta-sigma modulation circuit after the frequency selection circuit terminates the search, and the first delta-sigma modulation circuit may be operated at a frequency lower than a frequency of the second delta-sigma modulation circuit.

According to the fractional N-PLL circuit according to this application example, since the first delta-sigma modulation circuit is configured to not be erroneously operated at the highest operation frequency necessary during the search of the operation ranges of the voltage controlled oscillator, it is possible to appropriately set the operation ranges of the voltage controlled oscillator. Further, according to the fractional N-PLL circuit according to this application example, since it is sufficient if the second delta-sigma modulation circuit does not malfunction at the highest frequency (frequency lower than the highest operation frequency during the search of the operation ranges) necessary in the steady state after the search of the operation ranges of the voltage controlled oscillator is terminated, it is not necessary to excessively increase the operation frequency of the second sigma-delta modulation circuit.

The fractional N-PLL circuit according to the application example may further include: a clock generation circuit that generates a first clock signal and a second clock signal using an output signal of the division circuit, a frequency of the first clock signal may be lower than a frequency of the second clock signal, and in the frequency selection circuit, the first delta-sigma modulation circuit may be operated in synchronization with the first clock signal, and the second delta-sigma modulation circuit is operated in synchronization with the second clock signal.

According to the fractional N-PLL circuit according to this application example, since the fractional N-PLL circuit can update the division ratio of the division circuit by operating the first delta-sigma modulation circuit using the first clock signal in synchronization with the output signal of the division circuit during the search of the operation ranges of the voltage controlled oscillator, it is possible to secure the approximation accuracy of the output frequency of the division circuit, and to appropriately set the operation range of the voltage controlled oscillator.

Further, according to the fractional N-PLL circuit according to this application example, since the fractional N-PLL circuit can update the division ratio of the division circuit by operating the second delta-sigma modulation circuit using the second clock signal in synchronization with the output signal of the division circuit after the search of the operation ranges of the voltage controlled oscillator is terminated, it is possible to secure the approximation accuracy of the output frequency of the division circuit, and to realize desired output frequency accuracy in the steady state.

An oscillator according to this application example includes the fractional N-PLL circuit according to any of the application examples described above.

An electronic device according to this application example includes the fractional N-PLL circuit according to any of the application examples described above.

A moving object according to this application example includes the fractional N-PLL circuit according to any of the application examples described above.

According to the oscillator, the electronic device, and the moving object according to these application examples, since a fractional N-PLL circuit capable of appropriately setting an operation range of a voltage controlled oscillator without excessively increasing a frequency at which the delta-sigma modulation is performed, it is possible to realize high practicability and high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, preferred embodiments of the invention will be described with reference to the accompanying drawings. The embodiments described below do not improperly limit the contents of the invention disclosed in the appended claims. Further, all configurations described below are not essential elements of the invention.

1. Oscillator

1-1. First Embodiment

Configuration of Oscillator

Figure 1:
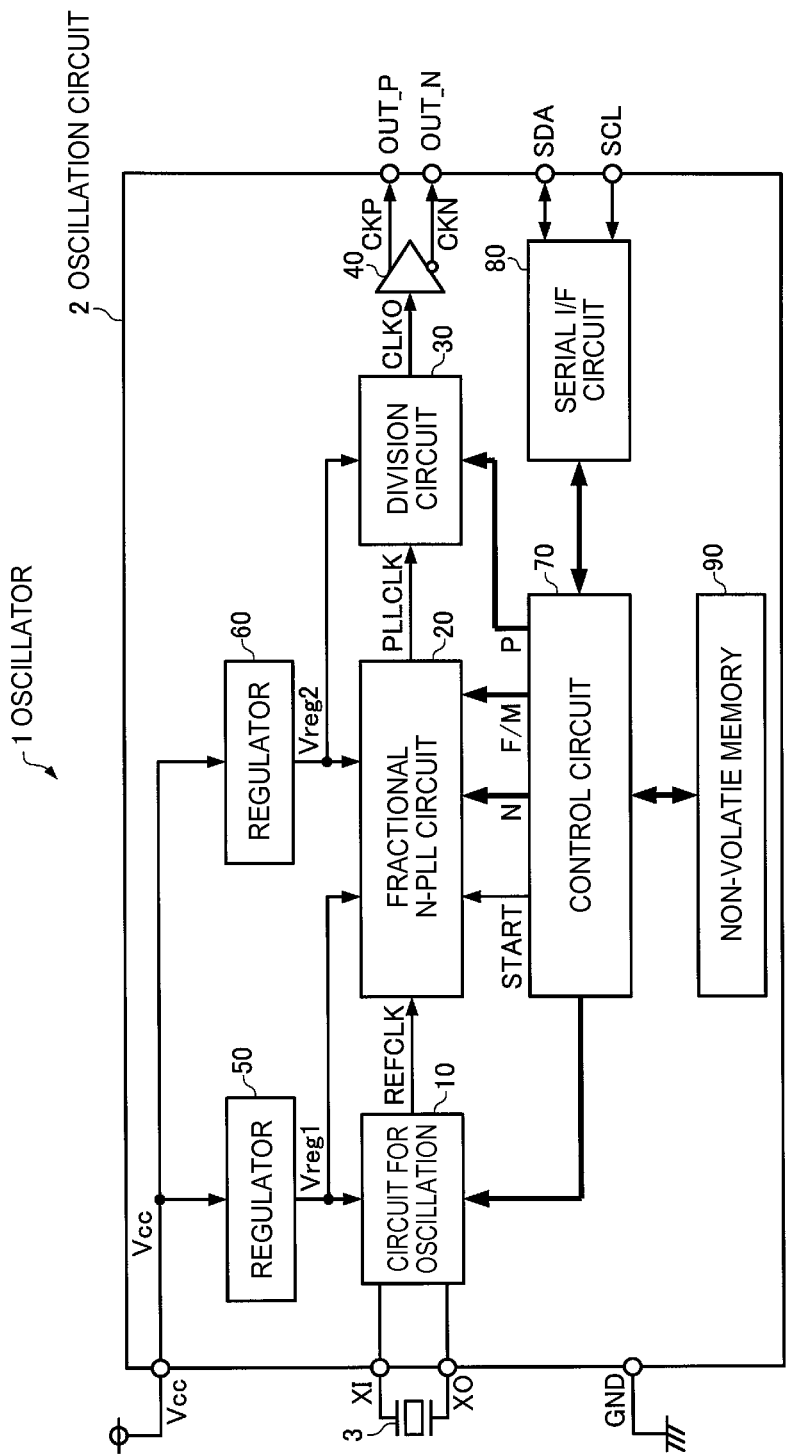
FIG. 1 is diagram illustrating a configuration of an oscillator of an embodiment of the invention.

FIG. 1 is diagram illustrating a configuration of an oscillator of an embodiment of the invention. As shown in FIG. 1, an oscillator 1 of the present embodiment is an oscillator that includes an oscillation circuit 2 and a vibrator 3, in which the oscillation circuit 2 and the vibrator 3 are accommodated in a package (not shown).

In the present embodiment, the vibrator 3 is a quartz crystal vibrator using quartz crystal as a substrate material, which may be an AT cut quartz crystal vibrator or an SC cut quartz crystal vibrator, for example. The vibrator 3 may be a surface acoustic wave (SAW) resonator or a micro electro mechanical systems (MEMS) vibrator. Further, as the substrate material of the vibrator 3, in addition to the quartz crystal, a piezoelectric material such as piezoelectric single crystal such as lithium tantalate or lithium niobate or piezoelectric ceramics such as lead zirconate titanate, a silicon semiconductor material, or the like may be used. Excitation means of the vibrator 3 may employ a piezoelectric effect, or may employ electrostatic driving due to a Coulomb force.

The oscillation circuit 2 is provided with a VCC terminal which is a power source terminal, a GND terminal which is a grounding terminal, an OUT_P terminal and an OUP_N terminal which are differential output terminals, an SDA terminal and an SCL terminal for external interfacing, and an XI terminal and an XO terminal which are connection terminals with respect to the vibrator 3. The VCC terminal, the GND terminal, the OUT_P terminal, the OUT_N terminal, the SDA terminal, and the SCL terminal are also connected to external terminals (not shown) of the oscillator 100.

In the present embodiment, the oscillation circuit 2 includes a circuit for oscillation 10, a fractional N-PLL circuit 20, a divider circuit 30, an output circuit 40, a regulator 50, a regulator 60, a control circuit 70, a serial interface (I/F) circuit 80, and a non-volatile memory 90. The oscillation circuit 2 of the present embodiment may have a configuration in which apart of these elements is not provided or changed, or a configuration in which other elements are added thereto. The oscillation circuit 2 may be configured by a semiconductor integrated circuit (IC) which is a single chip, or may be configured by plural ICs. Further, the oscillation circuit 2 may have a configuration which is partially formed by a discrete component.

The circuit for oscillation 10 is a circuit for oscillating the vibrator 3, and amplifies an output signal of the vibrator 3 to feed the result back to the vibrator 3. The circuit for oscillation 10 outputs a clock signal (oscillation signal) PLLCLK based on oscillation of the vibrator 3. For example, an oscillation circuit configured by the vibrator 3 and the circuit for oscillation 10 may be various types of oscillation circuits such as a pierce oscillation circuit, an inverter type oscillation circuit, a Colpitts oscillation circuit, or a Hartley oscillation circuit.

The fractional N-PLL circuit 20 generates a clock signal PLLCLK by multiplying a frequency (reflectance frequency) of the clock signal REFCLK according to a division ratio input from the control circuit 70. Here, when an integer part of the division ratio (integer division ratio) is represented as N and a fractional part (fractional division ratio) is represented as F/M, a relationship of Expression (1) is established between a frequency $f_{REFCLK}$ of the clock signal REFCLK and a frequency $f_{PLLCLK}$ of the clock signal PLLCLK.

$$f_{PLLCLK} = \left(N + \frac{F}{M}\right) \times f_{REFCLK} \quad (1)$$

The division circuit 30 divides the clock signal PLLCLK output from the fractional N-PLL circuit 20 by an output division ratio P (P is an integer of 1 or greater) input from the control circuit 70 to generate a clock signal CLKO. Here, a relationship of Expression (2) is established between the frequency $f_{PLLCLK}$ of the clock signal PLLCLK and a frequency $f_{CLKO}$ of the clock signal CLKO.

$$f_{CLKO} = \frac{f_{PLLCLK}}{P} \quad (2)$$

Accordingly, based on Expressions (1) and (2), a relationship of Expression (3) is established between the frequency $f_{REFCLK}$ of the clock signal REFCLK and the frequency $f_{CLKO}$ of the clock signal CLKO.

$$f_{CLKO} = \left(N + \frac{F}{M}\right) \times \frac{f_{REFCLK}}{P} \quad (3)$$

The output circuit 40 converts the clock signal CLKO output from the division circuit 30 into a differential signal formed by a non-inverted signal CKP and an inverted signal CKN. The non-inverted signal CKP is output to the outside from the output terminal OUT_P, and the inverted signal CKN is output to the outside from the output terminal OUT_N. The output circuit 40 may be a differential output circuit such as a low voltage differential signaling (LVDS) circuit, a positive emitter coupled logic (PECL) circuit or a low voltage PECL (LVPECL) circuit. Here, the output circuit 40 may be an output circuit of a single end.

The regulator 50 generates, based on a power source voltage Vcc supplied from the Vcc terminal, a constant voltage Vreg1 which is lower than Vcc. The constant voltage Vreg1 is supplied as a power source voltage of the circuit for oscillation 10 and a power source voltage of a partial circuit of the fractional N-PLL circuit 20.

The regulator 60 generates a constant voltage Vreg2 which is lower than Vcc based on the power source voltage Vcc supplied from the Vcc terminal. The constant voltage Vreg2 is supplied as a power source voltage of another partial circuit of the fractional N-PLL circuit 20 and as a power source voltage of the division circuit 30.

In the present embodiment, the constant voltage Vreg1 and the constant voltage Vreg 2 are the same voltage, but as long as malfunction does not occur in an interface portion between the circuit where Vreg1 is used as the power source voltage and the circuit where Vreg2 is used as the power source voltage, Vreg1 and the Vreg2 may be different from each other.

In the present embodiment, the serial interface circuit 80 is a digital interface circuit based on the I²C standard, which communicates a serial data signal with the SDA terminal and receives an input of a clock signal from the SCL terminal. Through the SDA terminal, the SCL terminal, and the serial interface circuit 80, read/write from an external device with respect to a control register (not shown) included in the control circuit 70 or the non-volatile memory 90 may be performed. The serial interface circuit 80 may be an interface circuit of a communication standard other than the I²C standard. Further, the oscillator 1 may not be provided with an external terminal for exclusive interfacing (in FIG. 1, the SDA terminal and the SCL terminal), and for example, may have a configuration in which the OUT_P terminal or the OUT_N terminal, or a functional terminal (not shown) is used as an external terminal for interfacing by mode switching due to an external operation.

The control circuit 70 includes a control register (not shown), and controls respective operations of the circuit for oscillation 10, the fractional N-PLL circuit 20, and the division circuit 30 according to setting values of the control register. The control register may perform setting of a frequency adjustment value or the like in the circuit for oscillation 10, setting of the integer division ratio N or the fractional division ratio F/M in the fractional N-PLL circuit 20, setting of a frequency selection start bit for search of operation ranges of the voltage controlled oscillator 24 (see FIG. 2) provided in the fractional N-PLL circuit 20 and selecting an output frequency range, setting of the output division ratio P of the division circuit 30, or the like. In the present embodiment, if an external device sets the integer division ratio N, the fractional division ratio F/M, and the output division ratio P through the serial interface circuit 80 and sets the frequency selection start bit to be active, the control circuit 70 generates a frequency selection start signal START (pulse signal) and supplies the generated signal to the fractional N-PLL circuit 20. The fractional N-PLL circuit 20 receives the frequency selection start signal START, searches for operation ranges of the voltage controlled oscillator 24, and selects a suitable operation range according to the integer division ratio N and the fractional division ratio F/M. Further, the division circuit 30 divides the clock signal PLLCLK according to the output division ratio P, so that a clock signal of a frequency determined by Expression (3) is output from the OUT_P terminal and the OUT_N terminal.

The non-volatile memory 90 is realized by an electrically erasable programmable read-only memory (EEPROM) or the like, and stores data or the like necessary for starting (power supply) the oscillator 1. For example, the non-volatile memory 90 may store control data for frequency adjustment or the like in an oscillation control circuit, initial values of the integer division ratio N, the fractional division ratio F/M and the output division ratio P, or the like. When the oscillator 1 is started (is supplied with power), for example, the control circuit 70 reads data stored in the non-volatile memory 90 to set the result in the control register, and performs a variety of controls.

Configuration of Fractional N-PLL Circuit

Figure 2:
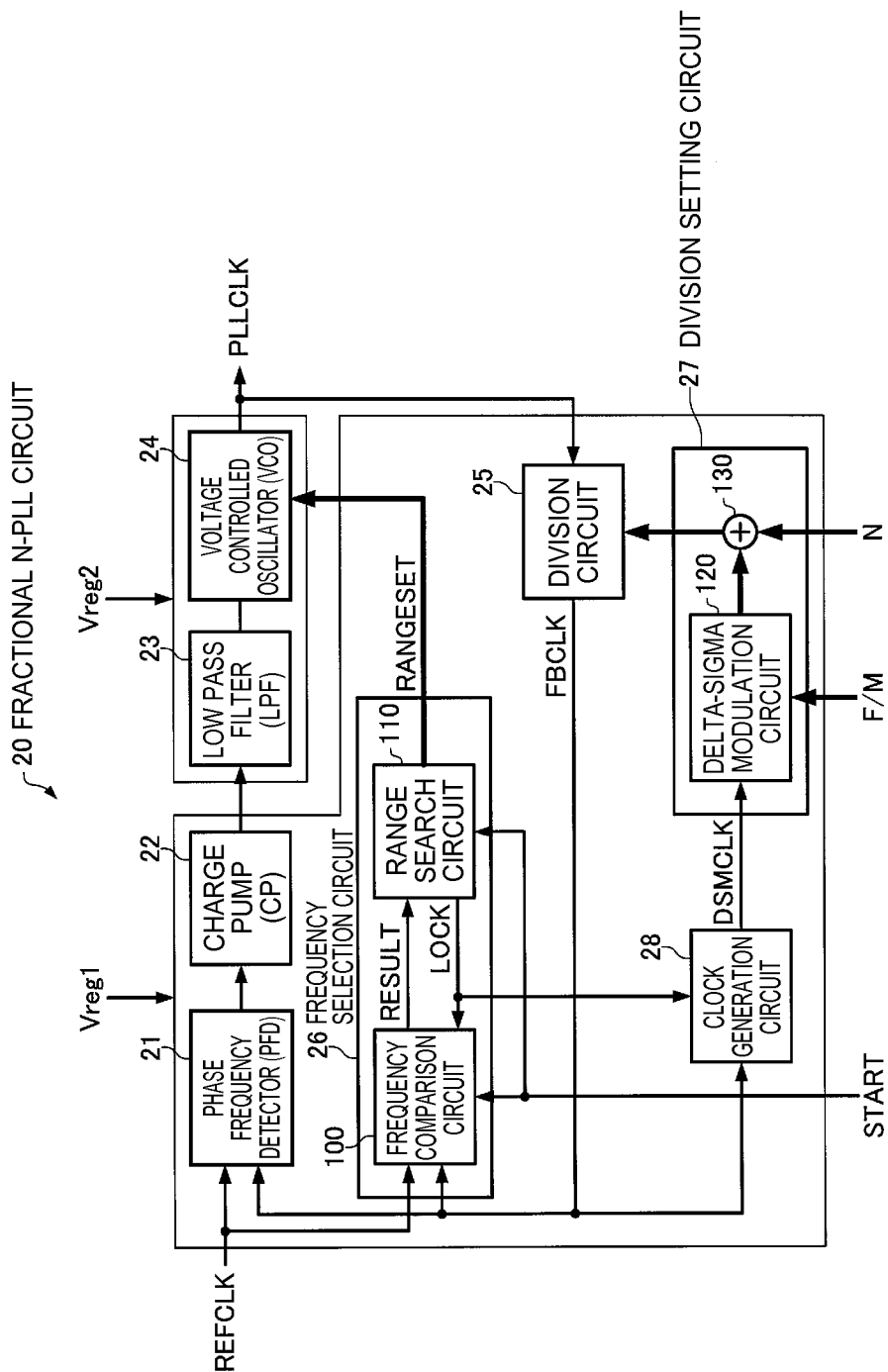
FIG. 2 is a diagram illustrating a configuration example of a fractional N-PLL circuit according to a first embodiment.

FIG. 2 is a diagram illustrating a configuration example of the fractional N-PLL circuit 20 according to the first embodiment. As shown in FIG. 2, the fractional N-PLL circuit 20 includes a phase frequency detector (PFD) 21, a charge pump (CP) 22, a low pass filter (LPF) 23, a voltage controlled oscillator (VCO) 24, a division circuit 25, a frequency selection circuit 26, a division setting circuit 27, and a clock signal generation circuit 28.

The phase frequency detector 21 detects a phase difference between a clock signal REFCLK output from the circuit for oscillation 10 and a clock signal FBCLK output from the division circuit 25, and outputs the detection result as a pulse voltage.

The charge pump 22 converts a pulse voltage output from the phase frequency detector 21 into an electric current, and the low pass filter 23 smoothes the electric current output from the charge pump 22 to perform voltage conversion.

The voltage controlled oscillator 24 sets an output voltage of the low pass filter 23 as a control voltage, and outputs a clock signal PLLCLK of which the frequency varies according to the control voltage. The voltage controlled oscillator 24 may set plural output frequency ranges with respect to a control voltage range, and selects any one of plural operation ranges according to a range setting signal RANGESET output from the frequency selection circuit 26 to thereby set a suitable output frequency range for outputting a clock signal PLLCLK of a target frequency. For example, the voltage controlled oscillator 24 may be configured to include a capacitor bank including plural capacitive elements and plural switch circuits, and to control switching of the switch circuits according to the range setting signal RANGESET to select a capacitive element which is a load capacitor of oscillation. Further, the voltage controlled oscillator 24 may be realized by various types of oscillation circuits such as an LC oscillation circuit configured using an inductance element such as a coil and a capacitive element such as a capacitor, or an oscillation circuit using a piezoelectric vibrator such as a quartz crystal vibrator.

Figures 3, 4:
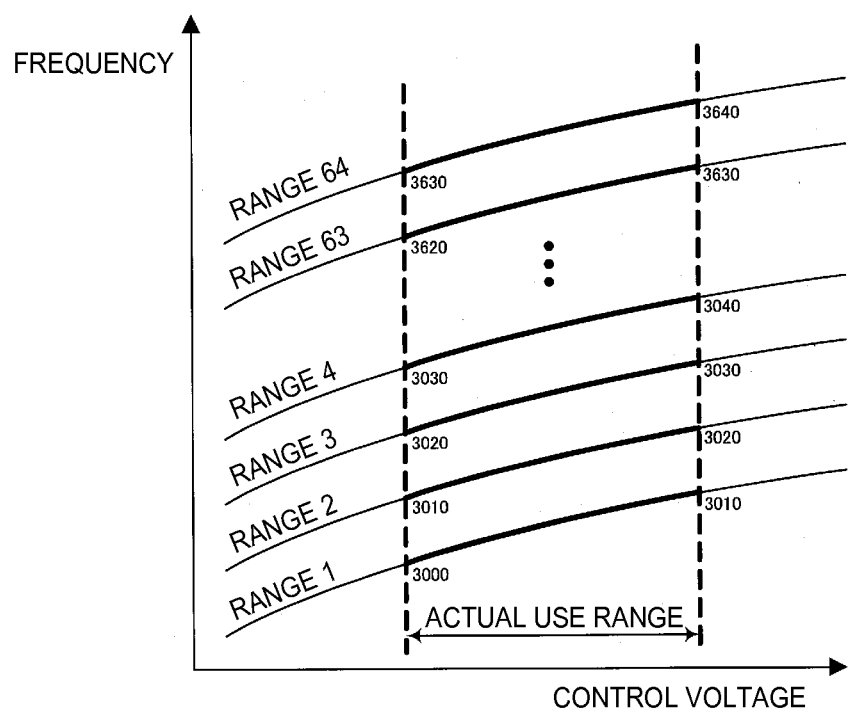
FIG. 3 is a diagram illustrating an example of a relationship between an operation range of a voltage controlled oscillator and an output frequency range thereof.
FIG. 4 is a diagram illustrating an example of a voltage control frequency characteristic of a voltage controlled oscillator.

FIG. 3 is a diagram illustrating an example of a relationship between an operation range of the voltage controlled oscillator 24 and an output frequency range thereof. In the example shown in FIG. 3, the voltage controlled oscillator 24 has 64 operation ranges having an output frequency range of 10 MHz, and switches the operation ranges by associating range 1 to range 64 with 0 to 63 which are range setting signals RANGESET, respectively, to output clock signals PLLCLK in the range of 3000 to 3640 MHz. In reality, as shown in FIG. 4, a voltage control frequency characteristic of the voltage controlled oscillator 24 is designed so that an output frequency range of each operation range overlaps an output frequency range of an adjacent operation range. In the example shown in FIG. 4, for example, an output frequency range of range 3 overlaps a part of an output frequency range of range 4 or a part of an output frequency range of range 2.

Accordingly, in each operation range, the output frequency range shown in FIG. 3 is present around the center of a control voltage range, which may be considered as a so-called practical use range. A remaining control voltage range other than the practical use range is secured to perform a control for tracing as a PLL system even though a free running frequency of the voltage controlled oscillator 24 varies due to the influence or the like of an ambient temperature after phase synchronization, and also has a function of absorbing manufacturing variation of the voltage controlled oscillator 24. In the example shown in FIGS. 3 and 4, the output frequency range of the voltage controlled oscillator 24 is a GHz bandwidth, but the range is not limited to the GHz bandwidth, and may be a MHz bandwidth or a kHz bandwidth.

Returning to FIG. 2, the division circuit 25 is provided on a signal path from an output end of the voltage controlled oscillator 24 to an input end of the voltage controlled oscillator 24, and outputs the clock signal FBCLK obtained by dividing the clock signal PLLCLK output from the voltage controlled oscillator 24 using an output signal of the division setting circuit 27 as a division ratio. As described above, a time average value of the output signal of the division setting circuit 27 matches a sum (N+F/M) of the integer division ratio N and the fractional division ratio F/M input from the control circuit 70. Further, in a steady state where the phase of the clock signal REFCLK and the phase of the clock signal FBCLK are synchronized, the frequency of the clock signal PLLCLK which is calculated by Expression (1) matches the frequency of the clock signal REFCLK, and thus, the clock signal CLKO becomes a desired frequency (target frequency) expressed by Expression (3).

If the frequency selection start signal START is received, the frequency selection circuit 26 performs a process of searching for plural operation ranges (output frequency ranges) of the voltage controlled oscillator 24 using the clock signal REFCLK output from the circuit for oscillation 10 and the clock signal FBCLK output from the division circuit 25, and selecting one operation range (output frequency range). In the present embodiment, the frequency selection circuit 26 includes a frequency comparison circuit 100 and a range search circuit 110.

If the frequency selection start signal START is received, the frequency comparison circuit 100 compares the frequency of the clock signal REFCLK with the frequency of the clock signal FBCLK, and outputs a comparison result signal RESULT. For example, the frequency comparison circuit 100 may compare the frequency of the clock signal REFCLK with the frequency of the clock signal FBCLK by comparing the number of pulses (the number of clocks) of the clock signal REFCLK with the number of pulses (the number of clocks) of the clock signal FBCLK for a predetermined period (gate period).

Figure 5:
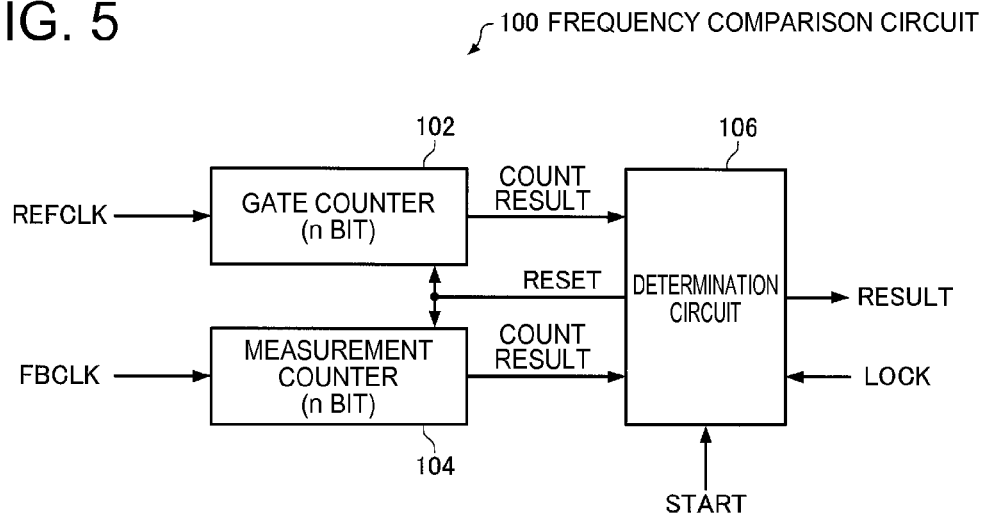
FIG. 5 is a diagram illustrating a configuration example of a frequency comparison circuit according to the first embodiment.

FIG. 5 is a diagram illustrating a configuration example of the frequency comparison circuit 100, in which the frequency comparison circuit 100 includes a gate counter 102, a measurement counter 104, and a determination circuit 105. The gate counter 102 and the measurement counter 104 are n-bit counters having the same configuration. The gate counter 102 is initialized to 0 when a reset signal RESET is active, and counts up the number of pulses (the number of clocks) of the clock signal REFCLK when the reset signal RESET is not active. Similarly, the measurement counter 104 is initialized to 0 when the reset signal RESET is active, and counts up the number of pulses (the number of clocks) of the clock signal FBCLK when the reset signal RESET is not active. If the frequency selection start signal START is received, the determination circuit 105 generates an active pulse of the reset signal RESET, and then determines, when the reset signal RESET is not active, whether the frequency of the clock signal FBCLK is higher or lower than the frequency of the clock signal REFCLK according to which one of the most significant bit of the gate counter 102 and the most significant bit of the measurement counter 104 first becomes 1. For example, if the most significant bit of the measurement counter 104 is 0 when the most significant bit of the gate counter 102 is changed from 0 to 1, the determination circuit 105 determines that the frequency of the clock signal FBCLK is lower than the frequency of the clock signal REFCLK, and outputs a low level comparison result signal RESULT. Further, if the most significant bit of the measurement counter 104 is 1 when the most significant bit of the gate counter 102 is changed from 0 to 1, the determination circuit 105 determines that the frequency of the clock signal FBCLK is higher than the frequency of the clock signal REFCLK, and outputs a high level comparison result signal RESULT. Until a lock signal LOCK output from the range search circuit 110 is received, the determination circuit 105 generates an active pulse of the reset signal RESET whenever the determination is terminated.

If the frequency selection start signal START is received, the range search circuit 110 changes a range setting signal RANGESET based on the comparison result signal RESULT output from the frequency comparison circuit 100 to search for plural operation ranges (output frequency ranges) of the voltage controlled oscillator 24, and selects one operation range (output frequency range) to fix the range setting signal RANGESET. Further, if the search of the operation ranges is terminated, the range search circuit 110 outputs the lock signal LOCK and stops its operation. The frequency comparison circuit 100 receives the lock signal LOCK and stops its operation. In the present embodiment, the range search circuit 110 searches for the operation ranges by a binary search method for limiting a search range of the operation ranges of the voltage controlled oscillator 24 to ½ according to the comparison result signal RESULT.

Figure 6:
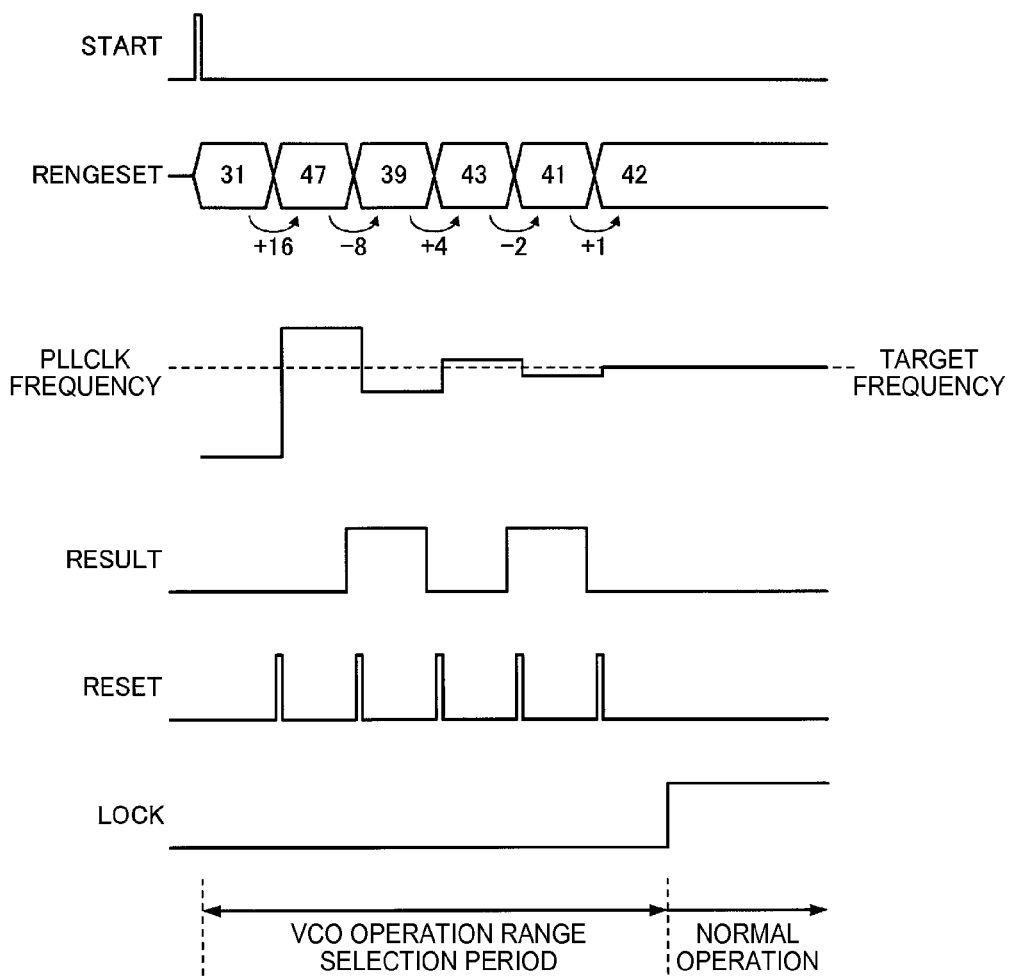
FIG. 6 is a diagram illustrating an example of a timing chart indicating an operation of a frequency selection circuit.

FIG. 6 is a diagram illustrating an example of a timing chart indicating an operation of the frequency selection circuit 26 when the voltage controlled oscillator 24 includes 64 operation ranges shown in FIGS. 3 and 4. In the example shown in FIG. 6, for example, it is assumed that a target frequency of the clock signal PLLCLK is 3425 MHz and range 43 (RANGESET=42) is most suitable. As shown in FIG. 6, if an active pulse of the frequency selection start signal START is input, the range search circuit 110 sets the range setting signal RANGESET to 31. Thus, the operation range of the voltage controlled oscillator 24 is initially set to range 32 disposed in the middle of the 64 ranges.

In the initial setting state, for example, when the frequency of the clock signal FBCLK is lower than the frequency of the clock signal REFCLK (when the frequency of the clock signal PLLCLK is lower than the target frequency), the frequency comparison circuit 100 outputs a low level comparison result signal RESULT. The range search circuit 110 receives the low level comparison result signal RESULT, and sets the range setting signal RANGESET to 47 which is obtained by addition of +16 to generate an active pulse of the reset signal RESET. Thus, the search range of the operation ranges of the voltage controlled oscillator 24 is limited to range 33 to range 64, and the operation range is set to range 48 disposed in the middle thereof.

In this setting state, for example, when the frequency of the clock signal FBCLK is higher than the frequency of the clock signal REFCLK (when the frequency of the clock signal PLLCLK is higher than the target frequency), the frequency comparison circuit 100 outputs a high level comparison result signal RESULT. The range search circuit 110 receives the high level comparison result signal RESULT, and sets the range setting signal RANGESET to 39 which is obtained by subtraction of −8 to generate an active pulse of the reset signal RESET. Thus, the search range of the operation ranges of the voltage controlled oscillator 24 is limited to range 33 to range 48, and the operation range is set to range 40 disposed in the middle thereof.

Similarly, hereinafter, the range search circuit 110 searches for the operation ranges of the voltage controlled oscillator 24 while narrowing down the search range by ½. Further, in a state where the range setting signal RANGESET is set to 42, the frequency of the clock signal FBCLK matches the frequency of the clock signal REFCLK (the frequency of the clock signal PLLCLK matches the target frequency). Since the frequency of the clock signal FBCLK matches the frequency of the clock signal REFCLK, the frequency comparison circuit 100 outputs a high level comparison result signal RESULT. The range search circuit 110 receives the high level comparison result signal RESULT, fixes the range setting signal RANGESET to 42 (range 43), and generates a lock signal LOCK.

For example, when the target frequency of the clock signal PLLCLK is 3435 MHz, and when the frequency of the clock signal FBCLK matches the frequency of the clock signal REFCLK (when the frequency of the clock signal PLLCLK matches the target frequency) in a state where the range setting signal RANGESET is 43 in FIG. 6, the frequency comparison circuit 100 outputs a low level comparison result signal RESULT in a state where the range setting signal RANGESET is set to 42. In this case, the range search circuit 110 receives the low level comparison result signal RESULT, fixes the range setting signal RANGESET to 43 (range 44) which is obtained by addition of +1, and generates a lock signal LOCK.

In this way, for example, when the voltage controlled oscillator 24 includes 64 operation ranges, it is possible to terminate the search of the operation ranges by 6 ($=\log_2 64$) times of determination by the binary search method, to thereby select a suitable operation range. If the search is sequentially performed from range 1 while increasing the range by 1, maximum 64 times of determination are necessary, and thus, it can be said that it is extremely effective to use the binary search method to reduce a starting period of time of the oscillator 1 (a period of time from the time when power is supplied to the time when a normal operation is started (to the time when the oscillator 1 reaches a steady state)).

Returning to FIG. 2, the division setting circuit 27 performs delta-sigma modulation using the fractional division ratio F/M, and sets a division ratio of the division circuit 25. In the present embodiment, the division setting circuit 27 includes a delta-sigma modulation circuit 120 and an addition/subtraction circuit 130. The delta-sigma modulation circuit 120 performs delta-sigma modulation for integrating the fractional division ratio F/M for quantization in synchronization with a clock signal DSMCLK output from the clock generation section 28. The addition/subtraction circuit 130 performs addition or subtraction for a delta-sigma modulation signal output from the delta-sigma modulation circuit 120 and the integer division ratio N. An output signal of the addition/subtraction circuit 130 is input to the division circuit 25 as an output signal of the division setting circuit 27. In the output signal of the division setting circuit 27, plural integer division ratios in a range around the integer division ratio N are changed in a time series manner, and a time average value thereof matches N+F/M.

For example, when the frequency of the clock signal REFCLK is 100 MHz and the target frequency of the clock signal PLLCLK is 3425 MHz, it is necessary that the time average value of the output signal of the division setting circuit 27, that is, a time average value of the division ratio of the division circuit 25 be 34.25. Thus, it is possible to set the integer division ratio N to 34, and to set the fractional division ratio F/M to 0.25.

Since 34.25 is a non-integer, the division ratio of 34.25 is approximately realized by changing the division ratio (integer value) of the division circuit 25 in a time series manner by the delta-sigma modulation in the delta-sigma modulation circuit 120. For example, by dividing a certain predetermined period into plural periods, setting the division ratio of the division circuit 25 to 34 in ¾ of the divided plural periods, and setting the division ratio of the division circuit 25 to 35 in the remaining ¼ periods, it is possible to approximate the division ratio to 34.25 in view of the number of pulses of the clock signal FBCLK in the predetermined period. Since this method is a method for obtaining the number of pulses of the clock signal FBCLK that is equivalent to the non-integer division in a pseudo manner, the approximation accuracy becomes high as the predetermined period becomes short. Further, in order to maintain the approximation accuracy of the number of pulses of the clock signal FBCLK, it is necessary that the delta-sigma modulation signal for switching the division ratio of the division circuit 25 be synchronized with the clock signal FBCLK. Thus, in the steady state, the delta-sigma modulation circuit 120 is operated by a clock signal of a frequency of 1/K (K is an integer of 1 or greater) of the frequency of the clock signal FBCLK. Accordingly, a minimum unit of the plural periods obtained by dividing the predetermined period is K clocks of the clock signal FBCLK. That is, the delta-sigma modulation circuit 120 updates the division ratio of the division circuit 25 every K clocks of the clock signal FBCLK. The division ratio to be updated does not use an integer value in a range of ±1 of a target non-integer division ratio but uses a further distant integer value, thereby making it possible to reduce the predetermined period. A specific numerical value is determined according to a design specification, but in many cases, the value is set in a range of about ±20% of the target non-integer division ratio. Accordingly, if the target non-integer division ratio is set to 34.25, the delta-sigma modulation circuit 120 outputs the integer division ratio of 27 (about 34.25×0.8) to 41 (about 34.25× 1.2) in a time series manner every K clocks of the clock signal FBCLK. Here, the frequency of the clock signal FBCLK varies in a range of ±20 of 100 MHz. Accordingly, in the case of such a design specification, in the steady state, it is preferable that the delta-sigma modulation circuit 120 follows an operation of maximum (120/M) MHz.

On the other hand, when searching for the operation ranges of the voltage controlled oscillator 24 by the binary search method in a state where the target frequency of the clock signal PLLCLK is 3425 MHz, the voltage controlled oscillator 24 may be momentarily operated in a range higher than range 43 which is finally selected. For example, in the example shown in FIG. 6, the highest range becomes range 48 (RANGESET=47), and in the examples shown in FIGS. 3 and 4, range 48 covers 3470 MHz to 3480 MHz. Accordingly, a highest frequency capable of being output from the voltage controlled oscillator 24 becomes 3480 MHz+α. Here, +α is a value in consideration of a frequency range higher than the actual use range in FIG. 4, but even though it is ignored, the highest frequency becomes 3480 MHz. Even when range 48 is selected, since the division ratio of the division circuit 25 is 27 to 41, the maximum frequency of the clock signal FBCLK is 128.8 MHz (=3480 MHz/27), and if the division ratio is changed every M clocks of the clock signal FBCLK, it is necessary that the delta-sigma modulation circuit 120 follow an operation of the maximum (128.8/M). The frequency is higher than the maximum operation frequency (120/M) of the delta-sigma modulation circuit 120 in the steady state. In consideration of an entire high speed search algorithm including the binary search method, if the division ratio is changed every M clocks of the clock signal FBCLK, it is necessary that the delta-sigma modulation circuit 120 be operated at a frequency of maximum 151.667 MHz (=3640 MHz/24) obtained by dividing the highest frequency 3640 MHz of the clock signal PLL-CLK by the minimum division ratio 24 (=30×0.8) when the minimum frequency 3000 MHz is a target frequency.

Accordingly, if the delta-sigma modulation circuit 120 has a configuration capable of corresponding to the operation of 151.667 MHz, an erroneous operation does not occur even though the range search is performed by an arbitrary high speed search algorithm. However, in order to operate the delta-sigma modulation circuit 120 at high speed, problems occur in power consumption and the circuit size. Particularly, when the fractional N-PLL circuit 20 is built in the same IC, the disadvantageous influence on the entire performance of the IC due to the high-speed operation of the delta-sigma modulation circuit 120 extremely increases. Further, most electronic devices have a strong tendency that a large amount of power is consumed at initial starting. This is because it is difficult to perform a power saving operation of properly controlling respective functions as in the steady state. Simultaneously, this problem similarly occurs in a device that is supplied with a signal from the fractional N-PLL circuit 20. Thus, until the fractional N-PLL circuit 20 reaches the steady state and supplies a signal, the device should wait in the starting process. Accordingly, it takes time to determine the operation range of the voltage controlled oscillator 24. Further, a problem occurs in that a larger amount of power is consumed than a stable control, which particularly causes a serious problem in a mobile device operated by a battery.

Thus, in the present embodiment, the division setting circuit 27 performs delta-sigma modulation at a frequency lower than a frequency after the frequency selection circuit 26 terminates the search while the frequency selection circuit 26 is searching for the plural operation ranges (output frequency ranges) of the voltage controlled oscillator 24. To this end, as shown in FIG. 2, the clock generation circuit 28 generates a clock signal DSMCLK with a frequency lower than a frequency after the frequency selection circuit 26 (range search circuit 110) terminates the search using the clock signal FBCLK while the frequency selection circuit 26 (range search circuit 110) is searching for the plural operation ranges (output frequency ranges) of the voltage controlled oscillator 24, and the delta-sigma modulation circuit 120 performs delta-sigma modulation in synchronization with the clock signal DSMCLK.

As described above, since it is necessary to update the delta-sigma modulation signal in synchronization with the clock signal FBCLK, it is preferable that the operation frequency of the delta-sigma modulation circuit 120 is a frequency obtained by dividing the frequency (output frequency of the division circuit 25) of the clock signal FBCLK by an integer. Thus, for example, it is preferable that the division setting circuit 27 (delta-sigma modulation circuit 120) performs delta-sigma modulation at a frequency of $1/N_1$ ($N_1$ is an integer of 2 or greater) of the output frequency of the division circuit 25 while the frequency selection circuit 26 is searching for the plural operation ranges (output frequency ranges) of the voltage controlled oscillator 24, and the division setting circuit 27 performs delta-sigma modulation at a frequency of $1/N_2$ ($N_2$ is an integer of 1 or greater, which is smaller than $N_1$) of the output frequency of the division circuit 25 after the frequency selection circuit 26 terminates the search. To this end, the clock generation circuit 28 generates a clock signal DSMCLK obtained by dividing the clock signal FBCLK by $N_1$ while the frequency selection circuit 26 (the range search circuit 110) is searching for the plural operation ranges (output frequency ranges) of the voltage controlled oscillator 24 (when the lock signal LOCK is at a low level), and generates a clock signal DSMCLK obtained by dividing the clock signal FBCLK by $N_2$ after the frequency selection circuit 26 (the range search circuit 110) terminates the search (when the lock signal LOCK is at a high level).

Even though the division ratio $N_1$ is a non-integer, or even though the updating of the clock signal FBCLK and the delta-sigma modulation signal is in a non-synchronous state, if the frequency of the clock signal DSMCLK is equal to or smaller than the highest frequency (in the above-described example, 120 MHz) of the clock signal DSMCLK (the $N_2$ clock signal of the clock signal FBCLK) in the steady state during the search of the operation ranges of the voltage controlled oscillator 24, the problem of the operation speed of the delta-sigma modulation circuit 120 is solved. However, since there is a possibility that the control of the delta-sigma modulation is deviated from a desired operation, it may be preferable that $N_1$ is an integer.

The integer value of the division ratio $N_1$ may be infinite values such as 2, 3, 4, and so on, but if the division ratio $N_1$ increases, the operation speed of the delta-sigma modulation circuit 120 becomes slow during the search of the operation ranges of the voltage controlled oscillator 24. For example, when $N_1$ is set to an infinitely large integer value, since the delta-sigma modulation circuit 120 is not almost operated, the division ratio of the division circuit 25 becomes a constant integer value. This means that the fractional N-PLL circuit 20 is operated in substantially the same way as an integer type PLL circuit, and that the problem of the operation speed of the delta-sigma modulation circuit 120 is completely solved. However, this causes a problem in that it is not possible to sufficiently cover the respective operation ranges of the voltage controlled oscillator 24 shown in FIGS. 3 and 4, and thus, it may be difficult to select a suitable operation range. For example, as in the example shown in FIGS. 3 and 4, when the frequency range of the clock signal PLLCLK is set to 3000 MHz to 3640 MHz and the clock signal REFCLK is set to 100 MHz, if the delta-sigma modulation circuit 120 is operated as the integer type PLL circuit, the division ratio of the division circuit 25 should be set to any one of seven integer values of 30 to 36. This means that the frequency of the clock signal PLLCLK corresponds to any one of seven types of frequencies with an interval of 100 MHz between 3000 MHz and 3600 MHz, and that it is not possible to select ranges other than seven ranges capable of outputting the seven types of frequencies among 64 operation ranges of the voltage controlled oscillator 24.

Further, the operation ranges of the voltage controlled oscillator 24 are 64 ranges in the example shown in FIG. 3 or 4, but the operation ranges may be designed to have 128 ranges or more without particular difficulty. When the number of settable division ratios of the division circuit 25 is not a sufficient value with respect to the number of operation ranges of the voltage controlled oscillator 24, the above-mentioned problem occurs. In other words, since it is possible to set countless non-integer division ratios in the fractional N-PLL circuit 20, even when the voltage controlled oscillator 24 having a large number of operation ranges is used, it is possible to use all operation ranges. By understanding such a mechanism, it may be preferable that $N_1$ is a minimum integer value such that a frequency obtained by $N_1$ division of a frequency obtained by dividing the highest frequency capable of being output from the voltage controlled oscillator 24 by the minimum division ratio (for example, 24) of the division circuit 25 does not exceed the highest operation frequency of the delta-sigma modulation circuit 120 in the steady state. According to the above-described example, since 3640 MHz/24=151.667 MHz, when $N_1$=2, the operation frequency of the delta-sigma modulation circuit 120 becomes 75.833 MHz. Since the highest operation frequency of the delta-sigma modulation circuit 120 in the steady state does not exceed 120 MHz (when $N_2$=1), it is preferable that $N_1$ is 2.

As shown in FIG. 2, in the present embodiment, the phase frequency detector 21, the charge pump 22, the division circuit 25, the frequency selection circuit 26, the division setting circuit 27, and the clock generation circuit 28 are supplied with a constant voltage Vreg1 as a power source voltage, similar to the circuit for oscillation 10. Further, the low pass filter 23 and the voltage controlled oscillator 24 are supplied with a constant voltage Vreg2 which is different from Vreg1 as a power source voltage. In this way, in the fractional N-PLL circuit 20, by separating a power source of a circuit operated at an input frequency (frequency of the clock signal REFCLK) from a power source of a circuit operated at an output frequency (frequency of the clock signal PLLCLK), voltage fluctuation of Vreg1 having noise of the input frequency does not overlap Vreg2 operated at the output frequency, and thus, it is possible to overlapping of noise with respect to the clock signal PLLCLK. Further, the circuit for oscillation 10 outputs the clock signal REFCLK of an amplitude (small amplitude) of the voltage Vreg1 which is lower than the power source voltage Vcc, and thus, energy necessary for transmission and reception of the clock signal REFCLK between the circuit for oscillation 10 and the fractional N-PLL circuit 20 is reduced. Accordingly, it is possible to reduce the size of noise mixed into the voltage controlled oscillator 24. Thus, it is possible to reduce phase noise or phase jitter of an output signal of the oscillator 1.

Operation Procedure of Fractional N-PLL Circuit

Figure 7:
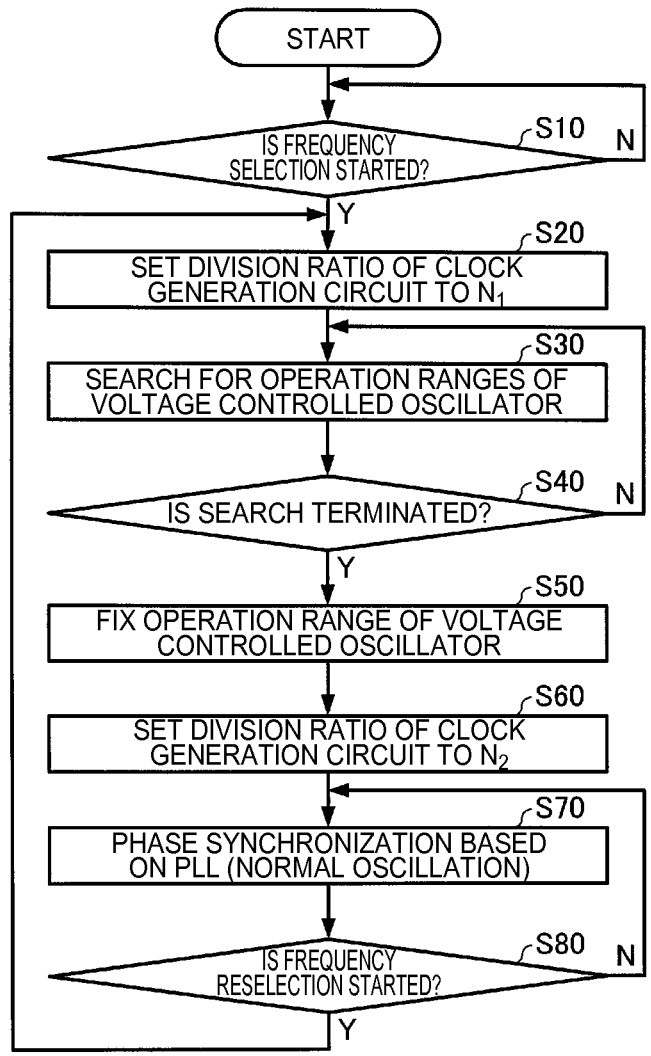
FIG. 7 is a flowchart illustrating an example of an operation procedure of the fractional N-PLL circuit according to the first embodiment.

FIG. 7 is a flowchart illustrating an example of an operation procedure of the fractional N-PLL circuit 20 according to the first embodiment.

In the procedure shown in FIG. 7, after power is supplied, the fractional N-PLL circuit 20 waits until the frequency selection start signal START is received (N in S10). For example, an external device sets the integer division ratio N and the fractional division ratio F/M in the control register provided in the control circuit 70 from a known frequency of the clock signal REFCLK according to the ratio of the frequency of the clock signal REFCLK to the target frequency of the clock signal PLLCLK, and sets the frequency selection start bit to be active. Thus, the control circuit 70 generates the frequency selection start signal START (pulse signal).

If the frequency selection start signal START is received (Y in S10), the fractional N-PLL circuit 20 sets the division ratio of the clock generation circuit 28 to $N_1$ (S20). In the present embodiment, since an initial value of the lock signal LOCK after power is supplied is at a low level, the division ratio of the clock generation circuit 28 is initially set to $N_1$.

Then, the fractional N-PLL circuit 20 searches for operation ranges of the voltage controlled oscillator 24 (S30). In the present embodiment, as the frequency selection start signal START is received, the range search circuit 110 searches for the operation ranges of the voltage controlled oscillator 24 based on the comparison result signal RESULT output from the frequency comparison circuit 100.

Further, the fractional N-PLL circuit 20 continuously performs the search while changing setting of the operation range (S30) until the search of the operation ranges is terminated (N in S40), and if the search of the operation ranges is terminated (Y in S40), the fractional N-PLL circuit 20 fixes the operation range(s) of the voltage controlled oscillator 24 (S50). In the present embodiment, when the search of the operation ranges is terminated, the range search circuit 110 fixes the operation range.

Further, the fractional N-PLL circuit 20 sets the division ratio of the clock generation circuit 28 to $N_2$ (S60). In the present embodiment, when the range search circuit 110 terminates the search of the operation ranges, the lock signal LOCK is set to a high level, and thus, the division ratio of the clock generation circuit 28 is set to $N_2$.

Then, the fractional N-PLL circuit 20 proceeds to a phase synchronization state (steady oscillation state) based on a PLL in the operation range fixed in step S50 (S70). Thus, the frequency of the clock signal PLLCLK matches the target frequency.

Further, the fractional N-PLL circuit 20 continues the phase synchronization state (steady oscillation state) based on the PLL. If the frequency selection start signal START is received (Y in S80), the fractional N-PLL circuit 20 performs the processes of step S30 and thereafter. For example, when the target frequency of the clock signal PLLCLK it changed, the external device sets the integer division ratio N and the fractional division ratio F/M again in the control register provided in the control circuit 70, and sets again the frequency selection start bit to be active. Thus, the control circuit 70 generates the frequency selection start signal START (pulse signal). In the present embodiment, as the range search circuit 110 receives the frequency selection start signal START, the lock signal LOCK is set at a low level. Thus, the division ratio of the clock generation circuit 28 is set to $N_1$, and the above-mentioned processes of step S40 and thereafter are performed.

In this way, in the present embodiment, whenever the external device sets the frequency selection start bit to be active, the fractional N-PLL circuit 20 performs the search of the operation ranges of the voltage controlled oscillator 24, and then proceeds to the steady oscillation state.

Effects

As described above, according to the oscillator 1 of the first embodiment, in the fractional N-PLL circuit 20, since the delta-sigma modulation circuit 120 is operated at the frequency lower than the frequency after the search is terminated while the frequency selection circuit 26 is searching for the operation ranges of the voltage controlled oscillator 24, even though the output frequency of the voltage controlled oscillator 24 becomes a high frequency which cannot be obtained in the steady state (in the normal operation) during the search, it is possible to normally set the division ratio of the division circuit 25. Further, according to the oscillator 1 of the first embodiment, since the fractional N-PLL circuit 20 updates the division ratio of the division circuit 25 in synchronization with the clock signal FBCLK during the search of the operation ranges of the voltage controlled oscillator 24, it is possible to secure the approximation accuracy of the frequency of the clock signal FBCLK. Accordingly, according to the oscillator 1 of the first embodiment, the fractional N-PLL circuit 20 can appropriately set the operation range of the voltage controlled oscillator 24 without excessively increasing the operation frequency of the delta-sigma modulation circuit 120.

Further, according to the oscillator 1 of the first embodiment, since the fractional N-PLL circuit 20 updates the division ratio of the division circuit 25 in synchronization of the clock signal FBCLK after the search of the operation ranges of the voltage controlled oscillator 24 is terminated, it is possible to secure the approximation accuracy of the frequency of the clock signal FBCLK, and to realize desired output frequency accuracy in the steady state.

Further, according to the oscillator 1 of the first embodiment, in the fractional N-PLL circuit 20, since the frequency of the clock signal DSMCLK is switched before and after the search of the operation ranges of the voltage controlled oscillator 24, it is possible to commonly use one delta-sigma modulation circuit 120 before and after the search. Accordingly, according to the oscillator 1 of the first embodiment, it is possible to suppress excessive increase in area cost of the fractional N-PLL circuit.

1-2. Second Embodiment

Hereinafter, a second embodiment will be described. The same reference numerals are given to the same components as in the first embodiment, and repetitive description will be omitted or simplified. An oscillator 1 of the second embodiment includes an oscillation circuit 2 and a vibrator 3, similar to the first embodiment. The oscillation circuit 2 and the vibrator 3 are accommodated in a package. Since an overall configuration of the oscillator 1 in the second embodiment is the same as in the configuration shown in FIG. 1, illustration and description thereof will not be repeated.

Figure 8:
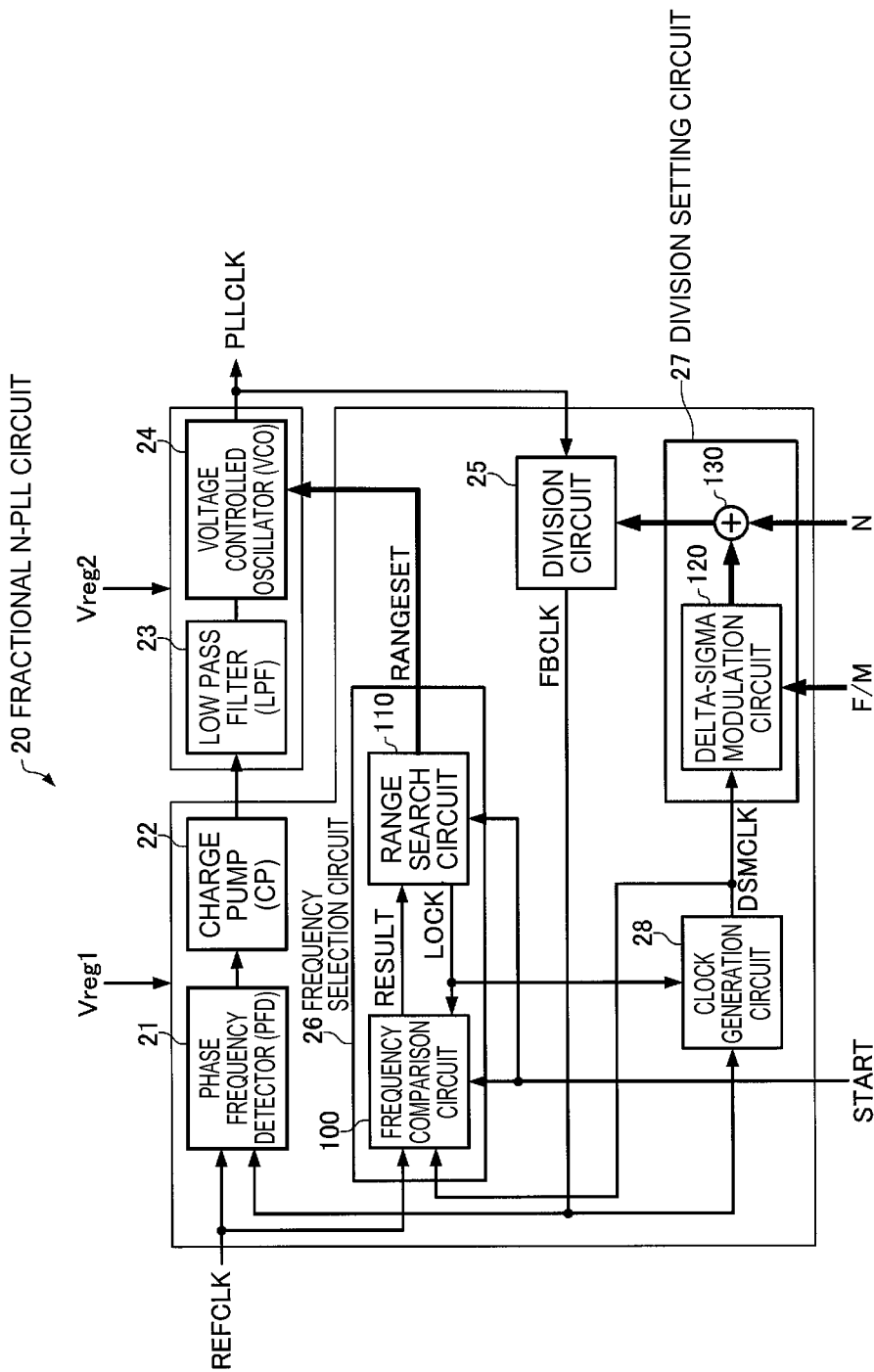
FIG. 8 is a diagram illustrating a fractional N-PLL circuit according to a second embodiment.

In the oscillator 1 according to the second embodiment, compared with the first embodiment, the function of the fractional N-PLL circuit 20 is the same, but a configuration thereof is different. FIG. 8 is a diagram illustrating a configuration example of the fractional N-PLL circuit 20 in the oscillator 1 according to the second embodiment. As shown in FIG. 8, in the second embodiment, similar to the first embodiment, the fractional N-PLL circuit 20 includes a phase frequency detector (PFD) 21, a charge pump (CP) 22, a low pass filter (LPF) 23, a voltage controlled oscillator (VCO) 24, a division circuit 25, a frequency selection circuit 26, a division setting circuit 27, and a clock signal generation circuit 28. Since functions and configurations of the phase frequency detector (PFD) 21, the charge pump (CP) 22, the low pass filter (LPF) 23, the voltage controlled oscillator (VCO) 24, the division circuit 25, the division setting circuit 27, and the clock signal generation circuit 28 are the same as in the first embodiment, description thereof will not be repeated.

If a frequency selection start signal START is received, the frequency selection circuit 26 performs a process of searching for plural operation ranges (output frequency ranges) of the voltage controlled oscillator 24 using a clock signal REFCLK output from the circuit for oscillation 10 and a clock signal DSMCLK output from the clock generation circuit 28 to select one operation range (output frequency range). The frequency selection circuit 26 has the same configuration as that of the first embodiment in that a frequency comparison circuit 100 and a range search circuit 110 are provided, but has a different configuration from that of the first embodiment in that the clock signal REFCLK and the clock signal DSMCLK are input to the frequency comparison circuit 100. Further, if the frequency selection start signal START is received, the frequency comparison circuit 100 compares a frequency of the clock signal REFCLK with a frequency of $N_1$ times a frequency of the clock signal DSMCLK, and outputs a comparison result signal RESULT.

As described in the first embodiment, while the frequency selection circuit 26 (range search circuit 110) is searching for the operation ranges of the voltage controlled oscillator 24, that is, while a lock signal LOCK is at a lower level, the clock signal DSMCLK is a clock obtained by dividing a clock signal FBCLK by $N_1$. Thus, a frequency of the clock signal FBCLK is equal to the frequency of $N_1$ times the frequency of the clock signal DSMCLK, comparison of the frequency of the clock signal REFCLK and the frequency of $N_1$ times the frequency of the clock signal DSMCLK corresponds to comparison of the frequency of the clock signal REFCLK and the frequency of the clock signal FBCLK.

Here, the frequency comparison circuit 100 does not actually increase the frequency of the clock signal DSMCLK by $N_1$ times, but compares the number of pulses (the number of clocks) of the clock signal REFCLK with $N_1$ times the number of pulses (the number of clocks) of the clock signal DSMCLK for a predetermined period (gate period) to compare the frequency of the clock signal REFCLK with the frequency of $N_1$ times the frequency of the clock signal DSMCLK.

Figure 9:
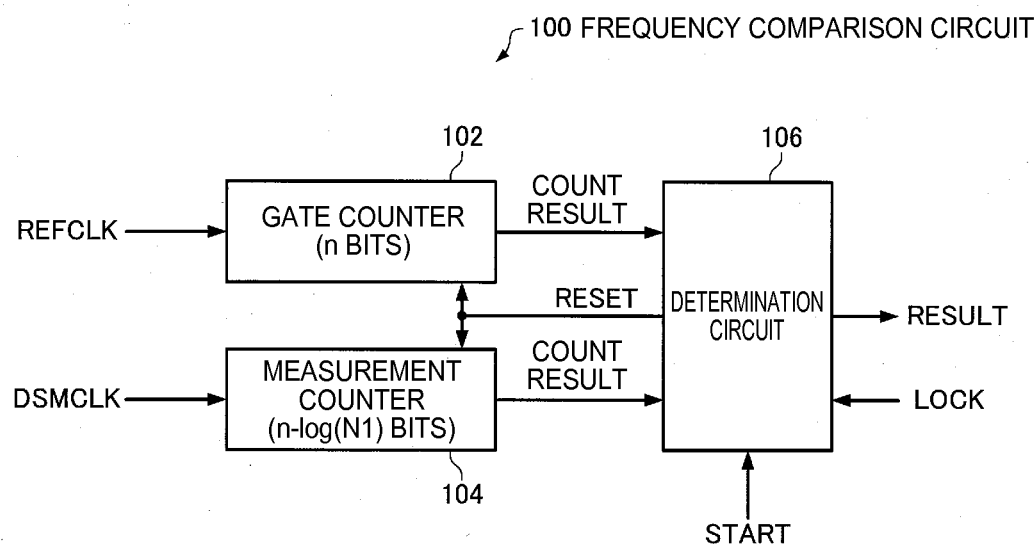
FIG. 9 is a diagram illustrating a configuration example of a frequency comparison circuit according to the second embodiment.

FIG. 9 is a diagram illustrating a configuration example of the frequency comparison circuit 100 in the oscillator 1 according to the second embodiment. The frequency comparison circuit 100 includes a gate counter 102, a measurement counter 104, and a determination circuit 105, similar to the first embodiment. The gate counter 102 is an n-bit counter, similar to the first embodiment. The gate counter 102 is initialized to 0 when a reset signal RESET is active, and counts up the number of pulses (the number of clocks) of the clock signal REFCLK when the reset signal RESET is not active. Further, differently from the first embodiment, the measurement counter 104 is a counter of $n-\log_2(N_1)$ bits ($N_1$ is a power of 2). The measurement counter 104 is initialized to 0 when the reset signal RESET is active, and counts up the number of pulses (the number of clocks) of the clock signal DSMCLK when the reset signal RESET is not active. Further, similar to the first embodiment, if the frequency selection start signal START is received, the determination circuit 105 generates an active pulse of the reset signal RESET. When the reset signal RESET is not active, the determination circuit 105 determines whether the frequency of the clock signal FBCLK is higher or lower than the frequency of the clock signal REFCLK according to which one of the most significant bit of the gate counter 102 and the most significant bit of the measurement counter 104 first becomes 1. Further, until the lock signal LOCK output from the range search circuit 110 is received, the determination circuit 105 generates an active pulse of the reset signal RESET whenever the determination is terminated.

In the frequency comparison circuit 100 with such a configuration, since the number of bits of the measurement counter 104 is $n-\log_2(N_1)$ while the number of bits of the gate counter 102 is n, the number of pulses (the number of clocks) of the clock signal REFCLK necessary until the most significant bit of the gate counter 102 becomes 1 is $N_1$ times the number of pulses (the number of clocks) of the clock signal DSMCLK necessary until the most significant bit of the measurement counter 104 becomes 1. That is, the frequency comparison circuit 100 compares the number of pulses (the number of clocks) of the clock signal REFCLK for a predetermined time (gate period) with $NH_1$ times the number of pulses (the number of clocks) of the clock signal DSMCLK.

When comparing the frequency selection circuit 26 in the second embodiment with that of the first embodiment, the number of bits of the measurement counter 104 is not changed in the first embodiment, but the number of bits of the measurement counter 104 decreases by $\log_2(N_1)$ bits in the second embodiment, and the frequency of the clock signal of the measurement counter 104 also decreases by $1/N_1$. Accordingly, according to the oscillator 1 of the second embodiment, compared with the first embodiment, it is possible to reduce the circuit area and also reduce power consumption during the search of the operation ranges of the voltage controlled oscillator 24.

As the number of bits of the measurement counter 104 by $\log_2(N_1)$ bits, the frequency comparison accuracy deteriorates. Thus, when the target frequency of the clock signal PLLCLK is set to a frequency around a boundary of the operation range of the voltage controlled oscillator 24, a probability that a range immediately above or below an operation range to be originally selected is selected increases. For example, when the operation ranges of the voltage controlled oscillator 24 are configured as shown in FIG. 3, and when the target frequency of the clock signal PLLCLK is 3031 MHz or 3039 MHz, range 4 is to be originally selected, but a possibility that range 3 or range 5 is selected increases. However, in reality, as shown in FIG. 4, in many cases, since a voltage control frequency characteristic of the voltage controlled oscillator 24 is designed so that an output frequency range of each operation range overlaps an output frequency range of an adjacent operation range, even though a range immediately above or below the original range is selected, the fractional N-PLL circuit 20 can continue steady oscillation.

According to oscillator 1 of the second embodiment described above, it is possible to achieve the same effects as in the oscillator 1 of the first embodiment. Further, according to the oscillator 1 of the second embodiment, since the fractional N-PLL circuit performs the search of the operation ranges of the voltage controlled oscillator 24 using a clock signal DSMCLK of a frequency lower than a frequency of the clock signal FBCLK, it is possible to reduce power consumption of the fractional N-PLL circuit compared with the oscillator 1 of the first embodiment.

1-3. Third Embodiment

An oscillator of a third embodiment will be described hereinafter. The same reference numerals are given to the same components as in the first embodiment, and repetitive description will be omitted or simplified. An oscillator 1 of the third embodiment is an oscillator that includes an oscillation circuit 2 and a vibrator 3, similar to the first embodiment. The oscillation circuit 2 and the vibrator 3 are accommodated in a package. Since an overall configuration of the oscillator 1 of the third embodiment is the same as in the configuration shown in FIG. 1, and illustration and description thereof will not be repeated.

Figure 10:
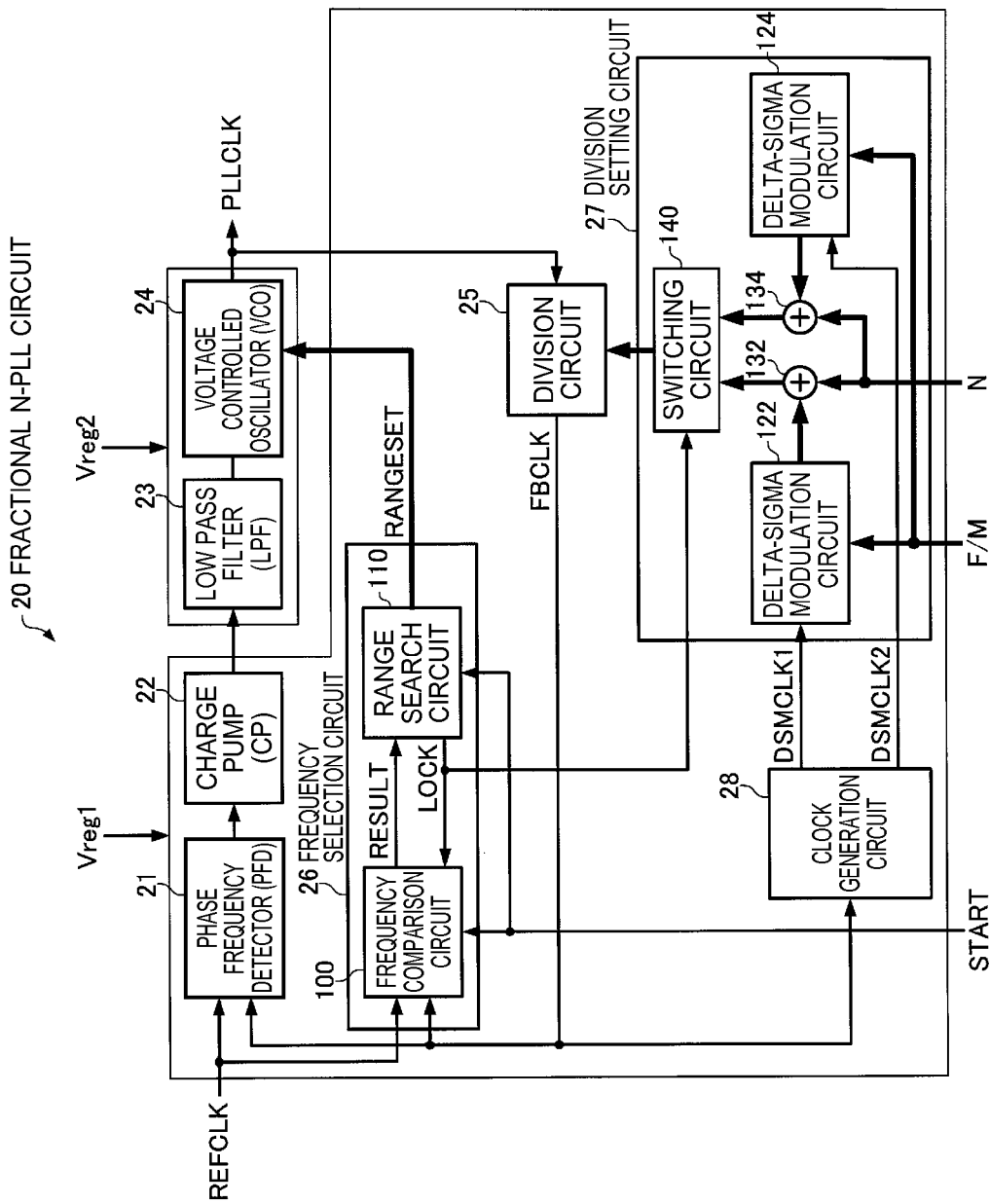
FIG. 10 is a diagram illustrating a configuration example of a fractional N-PLL circuit according to a third embodiment.

In the oscillator 1 of the third embodiment, compared with the first embodiment, a function of a fractional N-PLL circuit 20 is the same, but its configuration is different. FIG. 10 is a diagram illustrating an example of a configuration of the fractional N-PLL circuit 20 in the oscillator 1 of the third embodiment. As shown in FIG. 10, similar to the first embodiment, in the third embodiment, the fractional N-PLL circuit 20 includes a phase frequency detector (PFD) 21, a charge pump (CP) 22, a low pass filter (LPF) 23, a voltage controlled oscillator (VCO) 24, a division circuit 25, a frequency selection circuit 26, a division setting circuit 27, and a clock signal generation circuit 28. Since configurations of the phase frequency detector (PFD) 21, the charge pump (CP) 22, the low pass filter (LPF) 23, the voltage controlled oscillator (VCO) 24, the division circuit 25, and the frequency selection circuit 26 are the same as in the first embodiment, description thereof will not be repeated.

The division setting circuit 27 includes two delta-sigma modulation circuits 122 and 124, two addition/subtraction circuits 132 and 134, and a switching circuit 140.

The delta-sigma modulation circuit 122 (an example of a first delta-sigma modulation circuit) performs delta-sigma modulation for integrating and quantizing a fractional division ratio F/M, and the addition/subtraction circuit 132 performs addition or subtraction with respect to a delta-sigma modulation signal output from the delta-sigma modulation circuit 122 and a integer division ratio N.

Similarly, the delta-sigma modulation circuit 124 (an example of a second delta-sigma modulation circuit) performs delta-sigma modulation for integrating and quantizing the fractional division ratio F/M, and the addition/subtraction circuit 134 performs addition or subtraction with respect to a delta-sigma modulation signal output from the delta-sigma modulation circuit 124 and the integer division ratio N.

The switching circuit 140 selects and outputs an output signal of the delta-sigma modulation circuit 122 while the frequency selection circuit 26 (range search circuit 110) is searching for plural operation ranges (output frequency ranges) of the voltage controlled oscillator 24 (when the lock signal LOCK is at a low level), and selects and outputs an output signal of the delta-sigma modulation circuit 124 when the frequency selection circuit 26 (range search circuit 110) terminates the search (when the lock signal LOCK is at a high level). The output signal of the switching circuit 140 is input to the division circuit 25 as an output signal of the division setting circuit 27.

In the present embodiment, the delta-sigma modulation circuit 122 is operated at a frequency lower than a frequency at which the delta-sigma modulation circuit 124 is operated. That is, while the frequency selection circuit 26 is searching for the plural operation ranges (output frequency ranges) of the voltage controlled oscillator 24, the division setting circuit 27 performs delta-sigma modulation at a frequency lower than a frequency at which delta-sigma modulation is performed in the steady state after search to output a division ratio of the division circuit 25. To this end, as shown in FIG. 10, the clock generation circuit 28 generates a clock signal DSMCLK1 (an example of a first clock signal) and a clock signal DSMCLK2 (a second clock signal) using a clock signal FBCLK.

Here, the frequency of the clock signal DSMCLK1 is lower than the frequency of the clock signal DSMCLK2. For example, the clock signal DSMCLK1 may be a clock signal obtained by dividing the clock signal FBCLK by $N_1$ ($N_1$ is an integer of 2 or greater), and the clock signal DSMCLK1 may be a clock signal obtained by dividing the clock signal FBCLK by $N_2$ ($N_2$ is an integer of 1 or greater, which is smaller than $N_1$). Thus, while the frequency selection circuit 26 (range search circuit 110) is searching for the plural operation ranges (output frequency ranges) of the voltage controlled oscillator 24 (when the lock signal LOCK is at a low level), the delta-sigma modulation circuit 122 is operated at the same frequency as a frequency at which the delta-sigma modulation circuit 120 in the first embodiment is operated, and after the frequency selection circuit 26 (range search circuit 110) terminates the search (when the lock signal LOCK is at a high level), the delta-sigma modulation circuit 124 is operated at the same frequency as the frequency at which the delta-sigma modulation circuit 120 is operated. Further, similarly, an updating period of the input signal (division ratio) of the division circuit 25 is the same as that of the first embodiment. Accordingly, the problem of the operation speed of the delta-sigma modulation circuit described in the first embodiment is solved.

The delta-sigma modulation circuit 124 is operated in synchronization with the clock signal DSMCLK1 even while the frequency selection circuit 26 (range search circuit 110) is searching for the plural operation ranges (output frequency ranges) of the voltage controlled oscillator 24 (when the lock signal LOCK is at a low level), but since the output signal of the delta-sigma modulation circuit 124 is not selected by the switching circuit 140 during the search of the operation ranges, there is no problem even though the delta-sigma modulation circuit 124 performs an erroneous operation. Accordingly, it is sufficient if the delta-sigma modulation circuit 124 can be operated at the highest frequency (120 MHz in the above-described example) in the steady state, and thus, it is not necessary to excessively increase the operation frequency to prevent an erroneous operation during the search of the operation ranges.

Further, during the search of the plural operation ranges (output frequency ranges) of the voltage controlled oscillator 24 (when the lock signal LOCK is at a low level), the operation of the delta-sigma modulation circuit 124 may be stopped, and after the search of the operation ranges, the operation of the delta-sigma modulation circuit 122 may be stopped.

Figure 11:
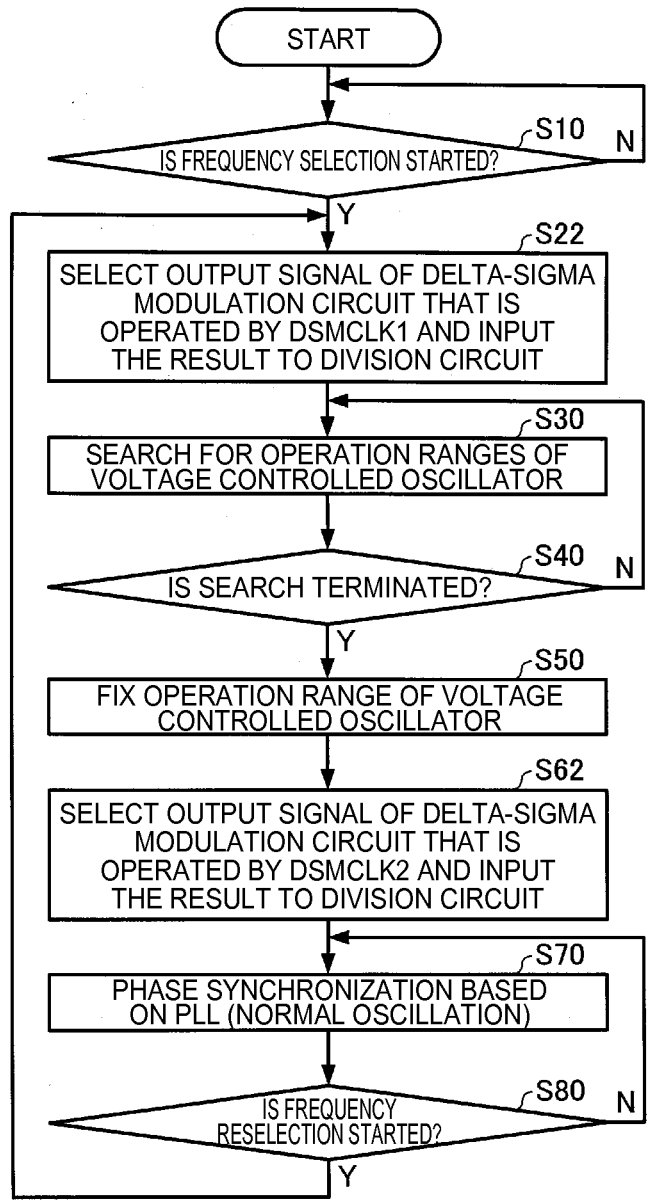
FIG. 11 is a flowchart illustrating an example of an operation procedure of the fractional N-PLL circuit according to the third embodiment.

FIG. 11 is a flowchart illustrating an example of an operation procedure of the fractional N-PLL circuit 20 according to the third embodiment. In FIG. 11, the same reference numerals as in FIG. 7 are given to steps of performing the same processes as in FIG. 7, and description thereof will not be repeated.

In the procedure shown in FIG. 11, similar to FIG. 7, after power is supplied, the fractional N-PLL circuit 20 waits until the frequency selection start signal START is received (N in S10).

If the frequency selection start signal START is received (Y in S10), the fractional N-PLL circuit 20 selects an output signal of the delta-sigma modulation circuit 122 that is operated by the clock signal DSMCLK1, and inputs the result to the division circuit 25 (S22). In the present embodiment, since an initial value of the lock signal LOCK after power is supplied is at a low level, the switching circuit 140 is initially set to select the output signal of the delta-sigma modulation circuit 122.

Then, the fractional N-PLL circuit 20 searches for operation ranges of the voltage controlled oscillator 24 (S30). Further, the fractional N-PLL circuit 20 continues the search while changing setting of the operation range (S30) until the search of the operation ranges is terminated (N in S40), and if the search of the operation ranges is terminated (Y in S40), the fractional N-PLL circuit 20 fixes the operation range of the voltage controlled oscillator 24 (S50).

Further, the fractional N-PLL circuit 20 selects an output signal of the delta-sigma modulation circuit 124 that is operated by the clock signal DSMCLK2, and inputs the result to the division circuit 25 (S62). In the present embodiment, when the range search circuit 110 terminates the search of the operation ranges, the fractional N-PLL circuit 20 sets a lock signal LOCK at a high level, and thus, the switching circuit 140 selects the output signal of the delta-sigma modulation circuit 124.

Then, the fractional N-PLL circuit 20 proceeds to a phase synchronization state (steady oscillation circuit) based on a PLL in the operation range fixed in step S50 (S70). Further, the fractional N-PLL circuit 20 continues the phase synchronization state (steady oscillation state) based on the PLL, and if the frequency selection start signal START is received (Y in S80), the fractional N-PLL circuit 20 performs the processes of step S30 and thereafter, again. In the present embodiment, as the range search circuit 110 receives the frequency selection start signal START, the lock signal LOCK is at a low level, and thus, the switching circuit 140 selects the output signal of the delta-sigma modulation circuit 122, and performs the above-described processes of step S40 and thereafter.

According to the oscillator 1 of the above-described third embodiment, the area cost of the fractional N-PLL circuit increases compared with the oscillator 1 in the first embodiment, but it is possible to achieve the same effects as in the oscillator 1 in the first embodiment.

2. Electronic Device

Figure 12:
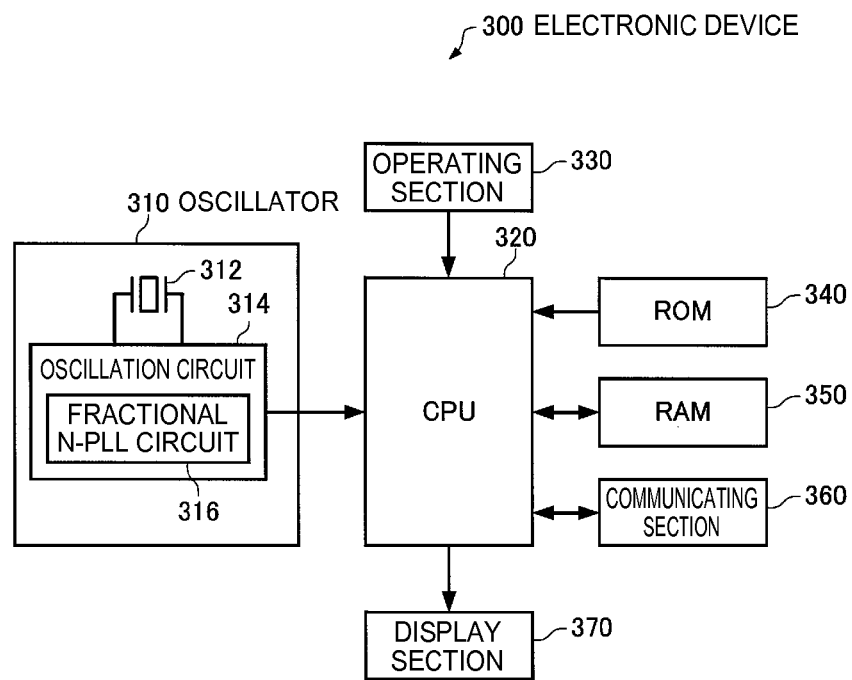
FIG. 12 is a functional block diagram of an electronic device according to an embodiment of the invention.
Figure 13:
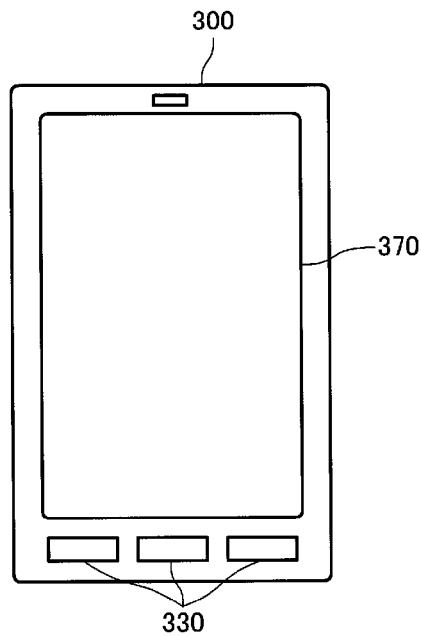
FIG. 13 is a diagram illustrating an appearance example of the electronic device according to the embodiment of the invention.

FIG. 12 is a functional block diagram illustrating an electronic device 300 according to an embodiment of the invention. Further, FIG. 13 is a diagram illustrating an appearance example of a smart phone which is an example of the electronic device according to the embodiment of the invention.

An electronic device 300 according to the present embodiment includes an oscillator 310, a central processing unit (CPU) 320, an operating section 330, a read only memory (ROM) 340, a random access memory (RAM) 350, a communicating section 360, and a display section 370. The electronic device of the present embodiment may have a configuration in which a part of the components (respective sections) shown in FIG. 12 are not provided or modified, or a configuration in which other components are added thereto.

The oscillator 310 includes a vibrator 312 and an oscillation circuit 314. The oscillation circuit 314 includes a fractional N-PLL circuit 316, frequency-converts an oscillation signal generated by oscillating the vibrator 312 by the fractional N-PLL circuit 316, and outputs the result to the CPU 320.

The CPU 320 performs various calculation processes or control processes using an oscillation signal input from the oscillator 310 as a clock signal according to a program stored in the ROM 340 or the like. Specifically, the CPU 320 performs various processes based on an operation signal from the operating section 330, a process of controlling the communicating section 360 to perform data communication with an external device, a process of transmitting a display signal to display a variety of information in the display section 370, or the like.

The operating section 330 is an input device configured by operation keys, button switches, or the like, and outputs an operation signal based on an operation from a user to the CPU 320.

The ROM 340 stores a program, data, or the like used when the CPU 320 performs various calculation processes or control processes.

The RAM 350 is used as a work area of the CPU 320, and temporarily stores a program or data read from the ROM 340, data input through the operating section 330, results of operations executed according to various programs by the CPU 320, or the like.

The communicating section 360 performs various controls for establishing data communication between the CPU 320 and an external device.

The display section 370 is a display section configured by a liquid crystal display (LCD), or the like, and displays a variety of information based on a display signal input from the CPU 320. A touch panel that functions as the operating section 330 may be provided in the display section 370.

For example, by applying the oscillator 1 of the above-described embodiments as the oscillator 310, by applying the oscillation circuit 2 of the above-described embodiments as the oscillation circuit 314, or by applying the fractional N-PLL circuit 20 of the above-described embodiments as the fractional N-PLL circuit 316, it is possible to achieve an electronic device with high practicality and high reliability.

Various electronic devices may be considered as the electronic device 300. For example, the electronic device may include a communication device (for example, an RF transmission module or an optical transmission device), a personal computer (for example, a mobile type personal computer, a laptop type personal computer, or a tablet type personal computer), a mobile terminal such as a smart phone or a mobile phone, a digital still camera, an inkjet type injection device (for example, an inkjet printer), a storage area network device such as a router or a switch, a local area network device, a moving object terminal base station device, a television, a video camera, a video recorder, a car navigator, a real time clock device, a pager, an electronic organizer (including a communication function), an electronic dictionary, an electronic calculator, an electronic game player, a game controller, a word processor, a work station, a TV phone, a TV monitor for crime prevention, electronic binoculars, a POS terminal, a medical device (for example, an electronic thermometer, a blood pressure manometer, a blood glucose monitoring system, an electrocardiographic apparatus, an ultrasonic diagnostic equipment, or an electronic endoscope), a fish-finder, various measuring apparatuses, meters (for example, meters of a vehicle, an airplane or a ship), a flight simulator, a head-mounted display, a motion trace, motion tracking, a motion controller, PDR (pedestrian position direction measurement), or the like.

3. Moving Object

Figure 14:
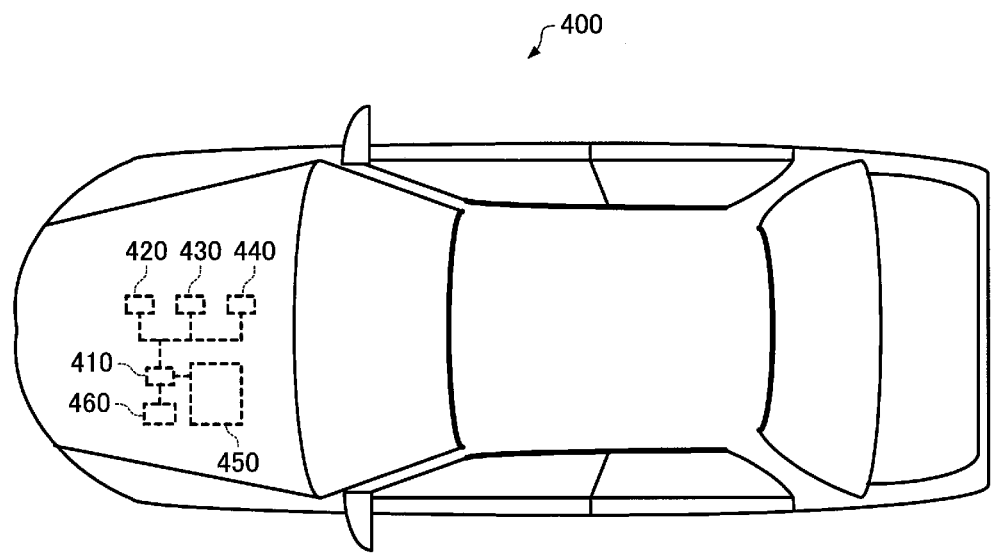
FIG. 14 is a diagram illustrating an example of a moving object according to an embodiment of the invention.

FIG. 14 is a diagram (top view) illustrating an example of a moving object according to an embodiment of the invention. A moving object 400 shown in FIG. 14 includes an oscillator 410, controllers 420, 430, and 440 that perform various controls for an engine system, a brake system, a keyless entry system and the like, a battery 450, and a backup battery 460. The moving object according to the present embodiment may have a configuration in which a part of the components (respective sections) shown in FIG. 14 are not provided or modified, or a configuration in which other components are added thereto.

The oscillator 410 includes an oscillation circuit and a vibrator (which are not shown), and the oscillation circuit frequency-converts an oscillation signal obtained by oscillating the vibrator using a fractional N-PLL circuit for output. An output signal of the oscillation circuit is output to the controllers 420, 430, and 440 through an external terminal of the oscillator 410, and is used as a clock signal, for example.

The battery 450 supplies power to the oscillator 410 and the controllers 420, 430, and 440. The backup battery 460 supplies power to the oscillator 410 and the controller 420, 430, and 440 when an output voltage of the battery 450 is lower than a threshold value.

For example, by applying the oscillator 1 of the above-described embodiments as the oscillator 410, by applying the oscillation circuit 2 of the above-described embodiments as the oscillation circuit provided in the oscillator 410, or by applying the fractional N-PLL circuit 20 of the above-described embodiments as the fractional N-PLL circuit provided in the oscillator 410, it is possible to achieve a moving object with high practicality and high reliability.

Various moving objects may be considered as the moving object 400. For example, the moving object 400 may include various moving objects such as an automobile (including electric automobile), an airplane such as a jet plane or a helicopter, a ship, a rocket, a satellite, or the like.

The invention is not limited to the above-described embodiments, and may include various modifications in a range without departing from the spirit of the invention.

The above-described embodiments and modification examples are only examples, and the invention is not limited thereto. For example, the invention may include combinations of the respective embodiments and the respective modification examples.

The invention includes substantially the same configurations (for example, configurations having the same functions, methods and results, or configurations having the same objects and effects) as the configurations described in the embodiments. Further, the invention includes configurations in which a part that is not essential in the configurations described in the embodiments is substituted. Furthermore, the invention includes configurations having the same effects as in the configurations described in the embodiments, or configurations capable of achieving the same objects as in the configurations described in the embodiments. In addition, the invention includes configurations in which known techniques are added to the configurations described in the embodiments.

The entire disclosure of Japanese Patent Application No. 2014-186606, filed Sep. 12, 2014 is expressly incorporated by reference herein.

What is claimed is:

1. A fractional N-PLL circuit comprising:
    a voltage controlled oscillator that is configured to set a plurality of output frequency ranges with respect to a control voltage range;
    a frequency selection circuit that searches for the plurality of output frequency ranges of the voltage controlled oscillator to select one output frequency range;
    a division circuit that is provided on a signal path from an output end of the voltage controlled oscillator to an input end of the voltage controlled oscillator; and
    a division setting circuit that performs delta-sigma modulation to set a division ratio of the division circuit,
    wherein the division setting circuit performs, while the frequency selection circuit is searching for the plurality of output frequency ranges, the delta-sigma modulation at a frequency lower than a frequency after the frequency selection circuit terminates the search.

2. The fractional N-PLL circuit according to claim 1, wherein the division setting circuit performs the delta-sigma modulation at a frequency of $1/N_1$ ($N_1$ is an integer of 2 or greater) of an output frequency of the division circuit while the frequency selection circuit is searching for the plurality of output frequency ranges.

3. The fractional N-PLL circuit according to claim 2, wherein the division setting circuit performs the delta-sigma modulation at a frequency of $1/N_2$ ($N_2$ is an integer of 1 or greater, which is smaller than $N_1$) of the output frequency of the division circuit after the frequency selection circuit terminates the search of the plurality of output frequency ranges.

4. The fractional N-PLL circuit according to claim 1, further comprising:
a clock generation circuit that generates, while the frequency selection circuit is searching for the plurality of output frequency ranges, a clock signal with a frequency lower than a frequency after the frequency selection circuit terminates the search using an output signal of the division circuit,
wherein the division setting circuit performs the delta-sigma modulation in synchronization with the clock signal.

5. The fractional N-PLL circuit according to claim 4, wherein the frequency selection circuit searches for the plurality of output frequency ranges using the clock signal.

6. The fractional N-PLL circuit according to claim 1, wherein the division setting circuit includes
a first delta-sigma modulation circuit,
a second delta-sigma modulation circuit, and
a switching circuit that selects an output signal of the first delta-sigma modulation circuit while the frequency selection circuit is searching for the plurality of output frequency ranges, and selects an output signal of the second delta-sigma modulation circuit after the frequency selection circuit terminates the search, and
wherein the first delta-sigma modulation circuit is operated at a frequency lower than a frequency of the second delta-sigma modulation circuit.

7. The fractional N-PLL circuit according to claim 6, further comprising:
a clock generation circuit that generates a first clock signal and a second clock signal using an output signal of the division circuit,
wherein a frequency of the first clock signal is lower than a frequency of the second clock signal, and
in the frequency selection circuit, the first delta-sigma modulation circuit is operated in synchronization with the first clock signal, and the second delta-sigma modulation circuit is operated in synchronization with the second clock signal.

8. An oscillator comprising the fractional N-PLL circuit according to claim 1.

9. An oscillator comprising the fractional N-PLL circuit according to claim 2.

10. An oscillator comprising the fractional N-PLL circuit according to claim 3.

11. An oscillator comprising the fractional N-PLL circuit according to claim 4.

12. An electronic device comprising the fractional N-PLL circuit according to claim 1.

13. An electronic device comprising the fractional N-PLL circuit according to claim 2.

14. An electronic device comprising the fractional N-PLL circuit according to claim 3.

15. An electronic device comprising the fractional N-PLL circuit according to claim 4.

16. A moving object comprising the fractional N-PLL circuit according to claim 1.

17. A moving object comprising the fractional N-PLL circuit according to claim 2.

18. A moving object comprising the fractional N-PLL circuit according to claim 3.

19. A moving object comprising the fractional N-PLL circuit according to claim 4.

* * * * *